US010812026B2

United States Patent
Zhu et al.

(10) Patent No.: US 10,812,026 B2
(45) Date of Patent: *Oct. 20, 2020

(54) POWER AMPLIFIER LINEARIZATION SYSTEM AND METHOD

(71) Applicant: Skyworks Solutions, Inc., Irvine, CA (US)

(72) Inventors: Yu Zhu, Wellesley, MA (US); Oleksiy Klimashov, Burlington, MA (US); Dylan C. Bartle, Arlington, MA (US); Paul T. DiCarlo, Marlborough, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/450,373

(22) Filed: Jun. 24, 2019

(65) Prior Publication Data
US 2020/0052657 A1 Feb. 13, 2020

Related U.S. Application Data

(63) Continuation of application No. 16/127,688, filed on Sep. 11, 2018, now Pat. No. 10,381,985, which is a (Continued)

(51) Int. Cl.
*H03F 1/32* (2006.01)
*H04B 17/13* (2015.01)
(Continued)

(52) U.S. Cl.
CPC ............ *H03F 1/32* (2013.01); *H03F 1/0222* (2013.01); *H03F 1/3241* (2013.01); *H03F 3/195* (2013.01);
(Continued)

(58) Field of Classification Search
CPC ...... H04B 1/3822; H04B 1/40; H04B 1/0475; H04B 1/0007; H04B 1/18;
(Continued)

(56) References Cited

U.S. PATENT DOCUMENTS 5,264,752 A 11/1993 Savicki
6,407,634 B1 6/2002 Staudinger et al.
(Continued)

FOREIGN PATENT DOCUMENTS

GB 2398648 8/2004
GB 2409115 11/2006
(Continued)

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.
(Continued)

*Primary Examiner* — Ajibola A Akinyemi
(74) *Attorney, Agent, or Firm* — Knobbe, Martens, Olson & Bear, LLP

(57) ABSTRACT

Envelope tracking can be employed to reduce power consumption of a power amplifier, but envelope tracking can introduce nonlinearities to a power amplifier. These nonlinearities can manifest themselves as noise at the output of the power amplifier. Embodiments described herein provide techniques for characterizing a parameter indicative of power amplifier noise when envelope tracking is employed. Measurement of this parameter can permit power amplifier designers to decide whether to forgo envelope tracking if a power amplifier is too susceptible to such noise, redesign the power amplifier to improve compatibility with envelope tracking, or to employ distortion compensation circuitry to reduce the noise output by the power amplifier. Counterin-
(Continued)

tuitively, this distortion compensation circuitry may involve increasing the power, such as the envelope tracking power supply. However, increasing the power may be a desirable trade-off for increased linearity.

20 Claims, 21 Drawing Sheets

Related U.S. Application Data continuation of application No. 15/278,367, filed on Sep. 28, 2016, now Pat. No. 10,103,693.

(60) Provisional application No. 62/235,395, filed on Sep. 30, 2015.

(51) Int. Cl.
| | |
|---|---|
| H04B 1/04 | (2006.01) |
| H03F 3/195 | (2006.01) |
| H03F 3/213 | (2006.01) |
| H03G 3/30 | (2006.01) |
| H03F 1/02 | (2006.01) |
| H03F 3/24 | (2006.01) |

(52) U.S. Cl.
CPC ............ *H03F 3/213* (2013.01); *H03F 3/24* (2013.01); *H03F 3/245* (2013.01); *H03G 3/3042* (2013.01); *H04B 1/0475* (2013.01); *H04B 17/13* (2015.01); *H03F 2200/102* (2013.01); *H03F 2200/451* (2013.01); *H04B 2001/0408* (2013.01); *H04B 2001/0441* (2013.01)

(58) Field of Classification Search
CPC .............. H04B 2001/0408; H04B 14/06; H04B 17/13; H04B 1/0057; H04B 1/0483; H04B 1/52; H04B 1/04; H04B 2001/0425; H04B 17/12; H04B 1/00
USPC .......................................... 330/278
See application file for complete search history.

(56) References Cited

U.S. PATENT DOCUMENTS

| | | | |
|---|---|---|---|
| 6,583,664 B2 | 6/2003 | Mathe et al. | |
| 6,914,487 B1 | 7/2005 | Doyle et al. | |
| 7,482,869 B2 | 1/2009 | Wilson | |
| 8,094,764 B2 | 1/2012 | Lackey | |
| 8,224,234 B1* | 7/2012 | Schuster | H04K 3/42 342/13 |
| 8,587,377 B2 | 11/2013 | Khesbak et al. | |
| 8,803,605 B2 | 8/2014 | Fowers et al. | |
| 8,909,180 B1* | 12/2014 | Murji | H03C 1/06 330/127 |
| 8,947,162 B2 | 2/2015 | Wimpenny et al. | |
| 9,065,385 B2 | 6/2015 | Gorbachov | |
| 9,066,368 B2 | 6/2015 | Lorenz et al. | |
| 9,445,371 B2 | 9/2016 | Khesbak et al. | |
| 9,668,215 B2 | 5/2017 | Balteanu et al. | |
| 9,876,473 B2 | 1/2018 | Khesbak et al. | |
| 2002/0030543 A1 | 3/2002 | French et al. | |
| 2002/0101912 A1 | 8/2002 | Phelts et al. | |
| 2003/0155978 A1 | 8/2003 | Pehlke | |
| 2004/0083409 A1 | 4/2004 | Rozenblit et al. | |
| 2004/0198271 A1 | 10/2004 | Kang | |
| 2005/0064830 A1 | 3/2005 | Grigore | |
| 2005/0070233 A1 | 3/2005 | Sowlati | |
| 2005/0110562 A1 | 5/2005 | Robinson et al. | |
| 2006/0119425 A1 | 6/2006 | Phillips et al. | |
| 2007/0210771 A1 | 9/2007 | Wilson et al. | |
| 2007/0249304 A1 | 10/2007 | Snelgrove et al. | |
| 2007/0273449 A1 | 11/2007 | Wilson | |
| 2007/0279019 A1 | 12/2007 | Wilson | |
| 2008/0238387 A1 | 10/2008 | Schmeller et al. | |
| 2009/0004981 A1 | 1/2009 | Eliezer et al. | |
| 2009/0016086 A1 | 1/2009 | Huynh et al. | |
| 2009/0097591 A1 | 4/2009 | Kim | |
| 2009/0128236 A1 | 5/2009 | Wilson | |
| 2009/0289720 A1 | 11/2009 | Takinami et al. | |
| 2009/0302941 A1 | 12/2009 | Wimpenny | |
| 2011/0058601 A1 | 3/2011 | Kim et al. | |
| 2012/0139641 A1 | 6/2012 | Kaczman et al. | |
| 2012/0146731 A1 | 6/2012 | Khesbak | |
| 2012/0200354 A1 | 8/2012 | Ripley et al. | |
| 2012/0201065 A1 | 8/2012 | Nate et al. | |
| 2012/0269240 A1 | 10/2012 | Balteanu et al. | |
| 2012/0326783 A1 | 12/2012 | Mathe et al. | |
| 2013/0034139 A1 | 2/2013 | Khlat et al. | |
| 2013/0109441 A1 | 5/2013 | Lorenz et al. | |
| 2013/0109442 A1 | 5/2013 | Dakshinamurthy et al. | |
| 2013/0116017 A1 | 5/2013 | Zhang et al. | |
| 2013/0127548 A1 | 5/2013 | Popplewell et al. | |
| 2013/0200864 A1 | 8/2013 | Huang et al. | |
| 2013/0207731 A1 | 8/2013 | Balteanu | |
| 2013/0217345 A1 | 8/2013 | Balteanu | |
| 2013/0231069 A1 | 9/2013 | Drogi | |
| 2013/0293210 A1 | 11/2013 | Smith et al. | |
| 2014/0049321 A1 | 2/2014 | Gebeyehu et al. | |
| 2014/0084996 A1* | 3/2014 | Schwent | H03H 11/1291 327/551 |
| 2014/0198879 A1* | 7/2014 | Nentwig | H04B 17/12 375/297 |
| 2014/0213204 A1 | 7/2014 | Balteanu et al. | |
| 2014/0218109 A1 | 8/2014 | Wimpenny | |
| 2014/0240052 A1 | 8/2014 | Mao | |
| 2014/0300334 A1 | 10/2014 | Popplewell et al. | |
| 2014/0306763 A1 | 10/2014 | Hong et al. | |
| 2014/0312974 A1 | 10/2014 | Khesbak et al. | |
| 2014/0312977 A1 | 10/2014 | Kaczman et al. | |
| 2014/0361830 A1 | 12/2014 | Mathe et al. | |
| 2014/0361837 A1 | 12/2014 | Strange et al. | |
| 2015/0009980 A1 | 1/2015 | Modi et al. | |
| 2015/0105033 A1 | 4/2015 | Modi et al. | |
| 2015/0155834 A1 | 6/2015 | Ripley et al. | |
| 2015/0180421 A1 | 6/2015 | Balteanu et al. | |
| 2015/0188432 A1 | 7/2015 | Vannorsdel et al. | |
| 2015/0236654 A1 | 8/2015 | Jiang et al. | |
| 2015/0270806 A1 | 9/2015 | Wagh et al. | |
| 2015/0326184 A1 | 11/2015 | Balteanu et al. | |
| 2015/0365053 A1 | 12/2015 | Wimpenny | |
| 2016/0006396 A1 | 1/2016 | Wimpenny | |
| 2016/0006397 A1 | 1/2016 | Wimpenny | |
| 2016/0036389 A1 | 2/2016 | Balteanu et al. | |
| 2016/0050629 A1 | 2/2016 | Khesbak et al. | |
| 2016/0094192 A1 | 3/2016 | Khesbak et al. | |
| 2016/0099742 A1 | 4/2016 | Ripley et al. | |
| 2016/0118943 A1 | 4/2016 | Khesbak | |
| 2016/0174153 A1 | 6/2016 | Balteanu et al. | |
| 2016/0261239 A1 | 9/2016 | Khesbak et al. | |
| 2016/0277045 A1* | 9/2016 | Langer | H03L 7/087 |
| 2016/0336901 A1 | 11/2016 | Khesbak et al. | |
| 2017/0005625 A1 | 1/2017 | Zhu et al. | |
| 2017/0047953 A1 | 2/2017 | Balteanu et al. | |
| 2017/0093505 A1 | 3/2017 | Ripley et al. | |
| 2017/0179889 A1 | 6/2017 | Khesbak et al. | |
| 2017/0195972 A1 | 7/2017 | Drogi et al. | |
| 2017/0223632 A1 | 8/2017 | Balteanu et al. | |

FOREIGN PATENT DOCUMENTS

| | | |
|---|---|---|
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

(56) References Cited

FOREIGN PATENT DOCUMENTS

OTHER PUBLICATIONS

Huang et al. "A MASH Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009.

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

Wu et al. "A Two-Phase Switching Hybrid Supply Modulator for Polar Transmitters with 9% Efficiency Improvement," IEEE International Solid-State Circuits Conference, Feb. 2010, pp. 196-198.

Yousefzadeh et al. "Three-Level Buck Converter for Envelope Tracking Applications," IEEE Transactions on Power Electronics, vol. 21, No. 2, Mar. 2006, pp. 549-552.

\* cited by examiner

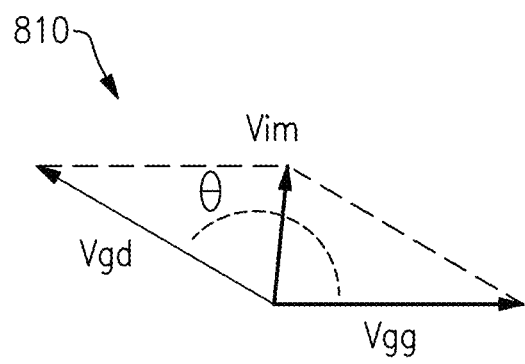 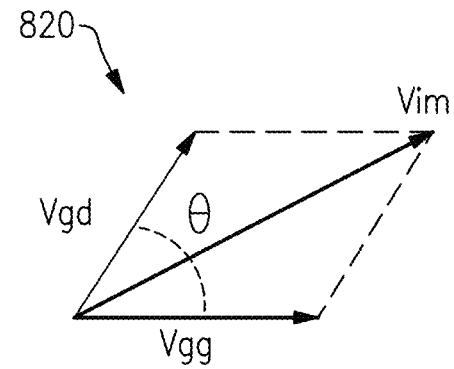
NOISE REDUCTION FOR θ>90     NOISE INCREASE FOR θ<90
FIG.8

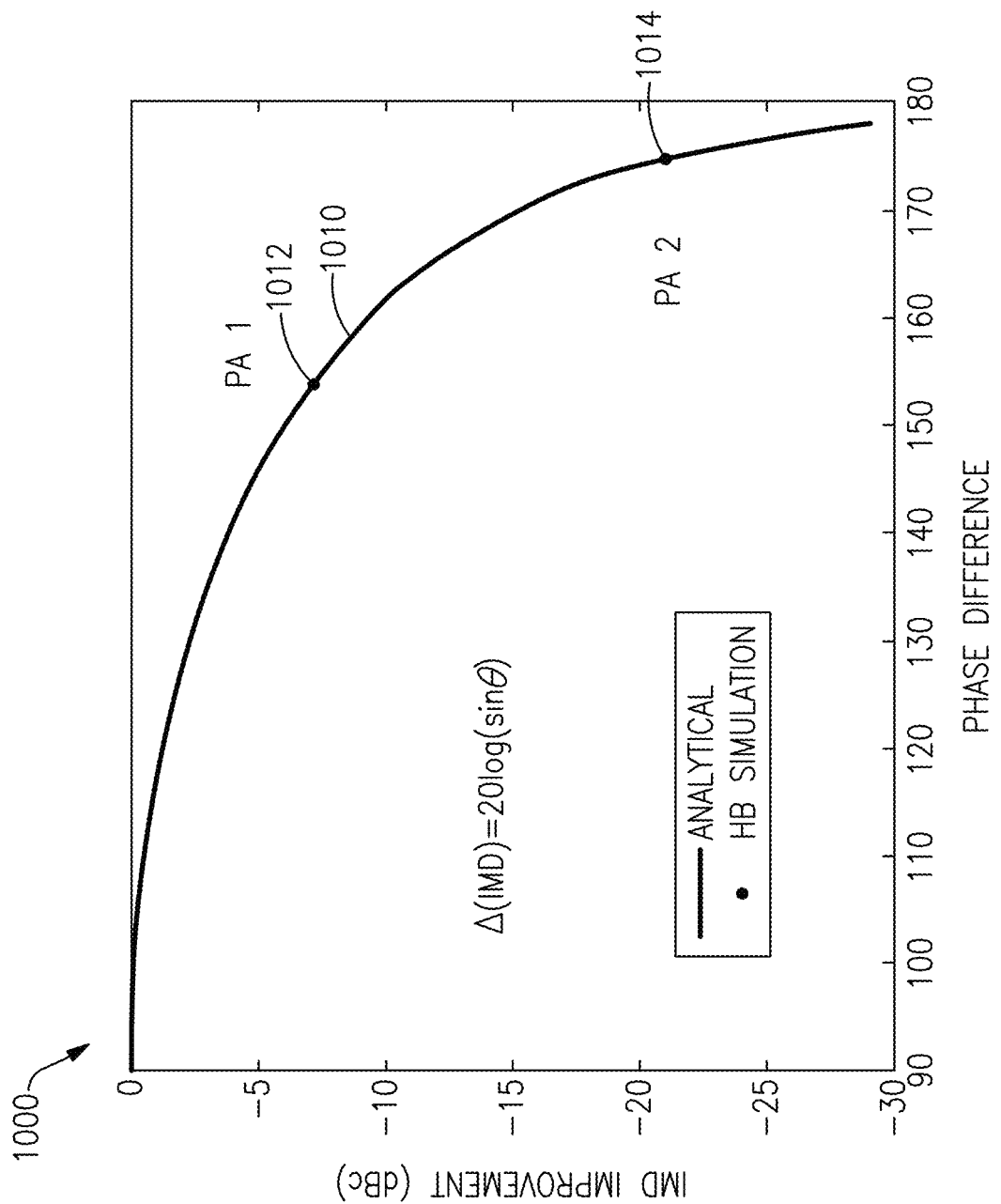

POWER AMPLIFIER LINEARIZATION SYSTEM AND METHOD

INCORPORATION BY REFERENCE TO ANY RELATED APPLICATIONS

Any and all applications, if any, for which a foreign or domestic priority claim is identified in the Application Data Sheet of the present application are hereby incorporated by reference under 37 CFR 1.57.

BACKGROUND

Power amplifiers can be included in mobile devices to amplify radio frequency (RF) signals for transmission via antennas. For example, in mobile devices using frequency division duplexing (FDD), such as systems using long term evolution (LTE), a power amplifier can be used to provide amplification to one or more transmit carrier frequencies. It can be important to manage RF signal amplification, as a desired transmit power level can depend on how far the user is away from a base station and/or the mobile environment.

The power consumption of a power amplifier can be an important consideration. One technique for reducing power consumption of a power amplifier is envelope tracking, in which a supply voltage of the power amplifier is controlled in relation to the envelope of the RF signal or signal envelope. Thus, when a voltage level of the signal envelope increases the voltage level of the power amplifier supply voltage can be increased. Likewise, when the voltage level of the signal envelope decreases the voltage level of the power amplifier supply voltage can be decreased to reduce power consumption.

SUMMARY

In certain embodiments, an envelope tracker characterization method includes providing a first input signal to a power amplifier, providing a second input signal to an envelope tracker circuit that generates a supply voltage signal for the power amplifier by tracking an envelope of the second input signal, delaying the second input signal or the supply voltage signal by an adjustable amount of delay, measuring intermodulation distortion (IMD) at the output of the power amplifier while adjusting the adjustable amount of delay, and calculating an IMD phase angle based on the measured intermodulation distortion and the amount of delay, the IMD phase angle indicative of linearity of the power amplifier.

In certain embodiments, the method of the preceding paragraph can be implemented together with any subcombination of the following features: the first input signal is a two-tone signal and the second input signal is a single tone signal; further including comparing the IMD phase angle with a threshold to analyze suitability of the power amplifier for use with the envelope tracker; delaying the second input signal further includes delaying the second input signal until the IMD reaches a first minimum; further including delaying the second input signal to the second delay amount until the IMD reaches a second minimum; calculating the IMD phase angle is further based on halving a phase difference between the first delay amount and the second delay amount; further including calculating a second delay value based on the IMD phase angle to use in a distortion compensation circuit with the power amplifier; further including calculating a gain value based on the IMD phase angle to use as a distortion compensation circuit with the power amplifier.

In certain embodiments, an apparatus includes a power amplifier, an envelope tracker configured to provide a power supply voltage to the power amplifier, and a distortion compensation circuit configured to compensate for intermodulation distortion due to the power amplifier mixing the power supply voltage with an input to the power amplifier.

In certain embodiments, the apparatus of the preceding paragraph can be implemented together with any subcombination of the following features: the distortion compensation circuit induces phase delay that increases a phase of an intermodulation distortion (IMD) phase angle; the distortion compensation circuit includes a delay circuit configured to delay the power supply voltage; the distortion compensation circuit includes a delay circuit configured to delay the input to the power amplifier; the distortion compensation circuit includes a gain circuit configured to amplify the power supply voltage; the distortion compensation circuit comprises a gain circuit configured to amplify the input to the power amplifier.

In certain embodiments, a wireless device includes a transceiver configured to generate a radio frequency signal and an envelope of the radio frequency signal, a power amplifier configured to amplify the radio frequency signal, an envelope tracker configured to generate a power supply voltage based on the envelope signal and provide the power supply voltage to the power amplifier, and a distortion compensation circuit configured to compensate for intermodulation distortion due to the power amplifier mixing the power supply voltage with the radio frequency signal.

In certain embodiments, the wireless device of the preceding paragraph can be implemented together with any subcombination of the following features: the distortion compensation circuit induces phase delay that increases a phase of an intermodulation distortion (IMD) phase angle; the distortion compensation circuit includes a delay circuit configured to delay the power supply voltage; the distortion compensation circuit includes a delay circuit configured to delay the radio frequency signal; the distortion compensation circuit includes a gain circuit configured to amplify the power supply voltage; the distortion compensation circuit includes a gain circuit configured to amplify the radio frequency signal.

Certain aspects, advantages and novel features of the inventions can be described herein. It can be to be understood that not necessarily all such advantages may be achieved in accordance with any particular embodiment of the inventions disclosed herein. Thus, the inventions disclosed herein may be embodied or carried out in a manner that achieves or selects one advantage or group of advantages as taught herein without necessarily achieving other advantages as may be taught or suggested herein.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

FIGS. 7-9 depict example vector relationships related to a power amplifier.

FIG. 10 depicts an example plot related to intermodulation distortion (IMD) phase angle.

DETAILED DESCRIPTION OF EMBODIMENTS

Figure 1:
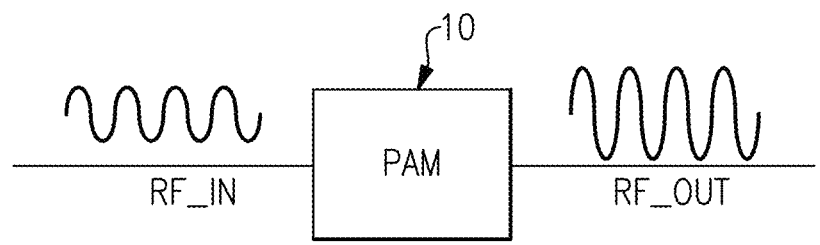
FIG. 1 is a schematic diagram of a power amplifier module for amplifying a radio frequency (RF) signal.

I. Introduction to Power Amplifiers and Envelope Tracking

The demand for higher data rates in mobile communication devices has created technical challenges for power amplifier systems. For example, certain mobile devices operate using carrier aggregation in which the mobile device communicates across multiple carriers, which can be in the same frequency band or in different frequency bands. Although carrier aggregation can increase bandwidth, carrier aggregation can have relatively stringent power amplifier linearity specifications. Furthermore, certain mobile devices can operate over a wide range of frequencies, including high frequency bands in which power amplifiers may exhibit relatively poor linearity.

Such technical challenges can be exacerbated by a desire to reduce a power amplifier system's cost by manufacturing power amplifier circuitry using complementary metal oxide semiconductor (CMOS) processing rather than III-V semiconductor processing, which typically can be more costly. However, manufacturing a power amplifier using CMOS processing may provide poor power amplifier linearity.

In certain configurations herein, a power amplifier system includes one or more power amplifiers and an envelope tracker, which generates one or more power amplifier supply voltages for the power amplifiers. The envelope tracker can control a power supply voltage of a particular power amplifier such that a voltage level of the power supply voltage changes in relation to an envelope of an RF signal amplified by the power amplifier.

Using envelope tracking can provide enhanced power performance relative to a configuration using a power supply voltage that has a constant voltage level. Additionally, envelope tracking can also improve the linearity of the power amplifier system by controlling the power amplifier's output voltage in relation to the envelope signal. For instance, since the envelope tracker changes a voltage level of the power amplifier output based on a low frequency component of the RF signal, the envelope tracker can improve the linearity of the power amplifier by changing the voltage of the power amplifier output at the envelope frequency.

In certain configurations herein, an envelope tracker includes a DC-to-DC converter, a current digital-to-analog converter (DAC), an error amplifier, a feedback circuit, and an AC combiner. Additionally, the current DAC receives a digital envelope signal, and uses the digital envelope signal to generate an envelope current. The feedback circuit is electrically connected between an output and an inverting input of the error amplifier, and the envelope current is provided to the error amplifier's inverting input. Additionally, the AC combiner generates a power amplifier supply voltage by combining an output of the DC-to-DC converter and an output of the error amplifier. In certain implementations, the error amplifier also generates an error current that is provided to the DC-to-DC converter to aid the DC-to-DC converter in tracking a low frequency component of the digital envelope signal. In certain configurations, the envelope tracker can further include one or more additional current DACs, one or more additional error amplifiers, one or more additional feedback circuits, and one or more AC combiners that can operate in conjunction with the DC-to-DC converter to generate additional power amplifier supply voltages. Thus, the envelope tracker can generate supply voltages for two or more power amplifiers using a common or shared DC-to-DC converter. Example implementations of such an envelope tracker are described in U.S. application Ser. No. 14/754,118, filed Jun. 29, 2015, titled "Apparatus and Methods for Wideband Envelope Tracking Systems," the disclosure of which is hereby incorporated by reference in its entirety. Any of the systems and methods described herein can be implemented in conjunction with any of the systems and methods described in the '118 application.

Using a digital envelope signal can achieve a wide variety of advantages in certain embodiments relative to a system using an analog envelope signal. For example, changes to the digital envelope signal can be self-aligned, which can provide enhanced performance relative to an envelope tracker operating using an analog envelope signal. For example, different frequency components of an analog envelope signal may have different group delays, which can lead to a loss of high frequency envelope information and/or a degradation of bandwidth and/or linearity. However, analog envelope signals may be used in some embodiments.

Additionally, in certain configurations, the digital envelope signal can be processed using digital signal processing (DSP) techniques to achieve high linearity and efficiency, which can enhance performance and/or permit the use of CMOS processing technologies for power amplification. The envelope tracker can be used in a wide variety of power amplifier systems, including power amplifier systems that use carrier aggregation to achieve high data rates.

FIG. 1 is a schematic diagram of a power amplifier module (PAM) 10 that can amplify a radio frequency (RF) signal. The illustrated power amplifier module 10 amplifies an RF signal (RF_IN) to generate an amplified RF signal (RF_OUT). As described herein, the power amplifier module 10 can include one or more power amplifiers.

Figure 2:
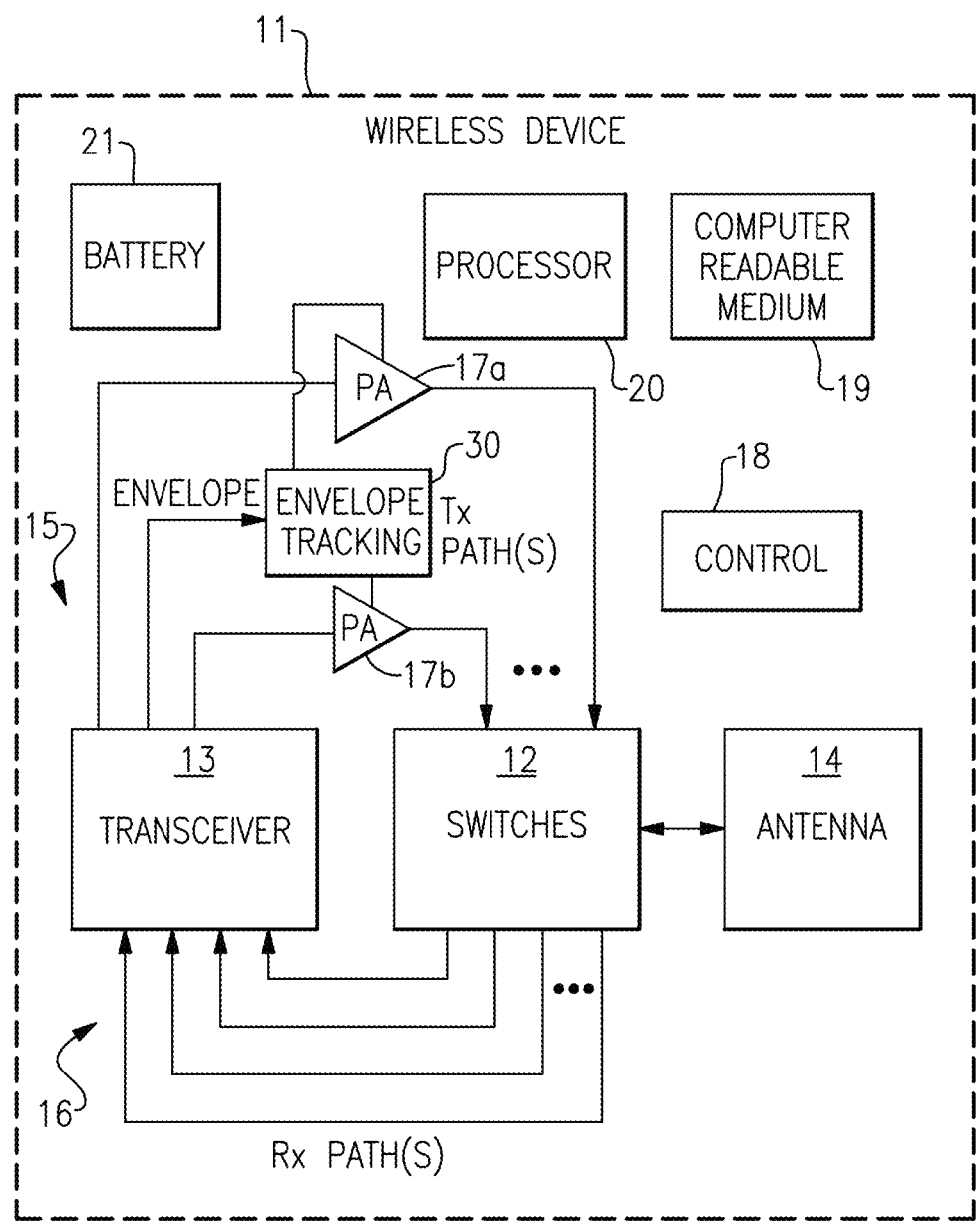
FIG. 2 is a schematic diagram of an example wireless device that can include one or more of the power amplifier modules of FIG. 1.

FIG. 2 is a schematic block diagram of an example wireless or mobile device 11 that can include one or more of the power amplifier modules 10 of FIG. 1. The wireless device 11 can also include an envelope tracking system.

The example wireless device 11 depicted in FIG. 2 can represent a multi-band and/or multi-mode device such as a multi-band/multi-mode mobile phone.

By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world. Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, 22 or more radio frequency spectrum bands.

One or more features of the present disclosure can be implemented in the foregoing example modes and/or bands, and in other communication standards. For example, 802.11, 2G, 3G, 4G, LTE, and Advanced LTE are non-limiting examples of such standards. To increase data rates, the wireless device 11 can operate using complex modulated signals, such as 64 QAM signals.

In certain embodiments, the wireless device 11 can include switches 12, a transceiver 13, an antenna 14, power amplifiers 17a, 17b, a control component 18, a computer readable medium 19, a processor 20, a battery 21, and an envelope tracker 30.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can provide both transmitting and receiving functionalities. In another example, transmitting and receiving functionalities can be provided by separate antennas. In yet another example, different bands associated with the wireless device 11 can operate using different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17a, 17b shown can represent amplifications associated with different power output configurations (e.g., low power output and high power output), and/or amplifications associated with different bands. Although FIG. 2 illustrates a configuration using two transmission paths 15 and two power amplifiers 17a, 17b, the wireless device 11 can be adapted to include more or fewer transmission paths 15 and/or more or fewer power amplifiers.

In FIG. 2, one or more detected signals from the antenna 14 are depicted as being provided to the transceiver 13 via one or more receiving paths 16. In the example shown, different receiving paths 16 can represent paths associated with different bands. For example, the four example receiving paths 16 shown can represent quad-band capability that some wireless devices are provided with. Although FIG. 2 illustrates a configuration using four receiving paths 16, the wireless device 11 can be adapted to include more or fewer receiving paths 16.

To facilitate switching between receive and transmit paths, the switches 12 can electrically connect the antenna 14 to a selected transmit or receive path. Thus, the switches 12 can provide a number of switching functionalities associated with operation of the wireless device 11. In certain embodiments, the switches 12 can include a number of switches that can provide functionalities associated with, for example, switching between different bands, switching between different power modes, switching between transmission and receiving modes, or some combination thereof. The switches 12 can also provide additional functionality, including filtering and/or duplexing of signals.

FIG. 2 shows that in certain embodiments, a control component 18 can be provided for controlling various control functionalities associated with operations of the switches 12, the power amplifiers 17a, 17b, the envelope tracker 30, and/or other operating components.

In certain embodiments, a processor 20 can facilitate implementation of various processes described herein. The processor 20 can implement various computer program instructions. The processor 20 can be a general purpose computer, special purpose computer, or other programmable data processing apparatus.

In certain embodiments, these computer program instructions may also be stored in a computer-readable memory 19 that can direct the processor 20 to operate in a particular manner, such that the instructions stored in the computer-readable memory 19.

The illustrated wireless device 11 also includes the envelope tracker 30, which can be used to provide power amplifier supply voltages to one or more of the power amplifiers 17a, 17b. For example, the envelope tracker 30 can change the supply voltages provided to the power amplifiers 17a, 17b based upon an envelope of the RF signal to be amplified. In the illustrated implementation, the envelope signal is provided to the envelope tracker 30 from the transceiver 13. However, other implementations are possible, including, for example, configurations in which the envelope signal is provided to the envelope tracker 30 from a baseband processor or a power management integrated circuit (PMIC). Furthermore, in certain implementations, the envelope signal can be generated from the RF signal by detecting the RF signal's envelope using any suitable envelope detector.

The envelope tracker 30 can be electrically connected to the battery 21, which can be any suitable battery for use in the wireless device 11, including, for example, a lithium-ion battery. As will be described in detail further below, by controlling the voltage provided to one or more of the power amplifiers 17a, 17b, the power consumed from the battery 21 can be reduced, thereby improving the battery life of the wireless device 11. In certain configurations, the power amplifiers 17a, 17b can be implemented using CMOS processing, which can lower cost and/or enhance integration. However, other configurations of the power amplifiers 17a, 17b are possible. For example, the power amplifiers 17a, 17b can be implemented using III-V semiconductor processing, such as Gallium Arsenide (GaAs) processing.

In certain configurations, the wireless device 11 may operate using carrier aggregation. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

FIGS. 3A-4B show two examples of power amplifier supply voltage versus time.

Figure 3A:
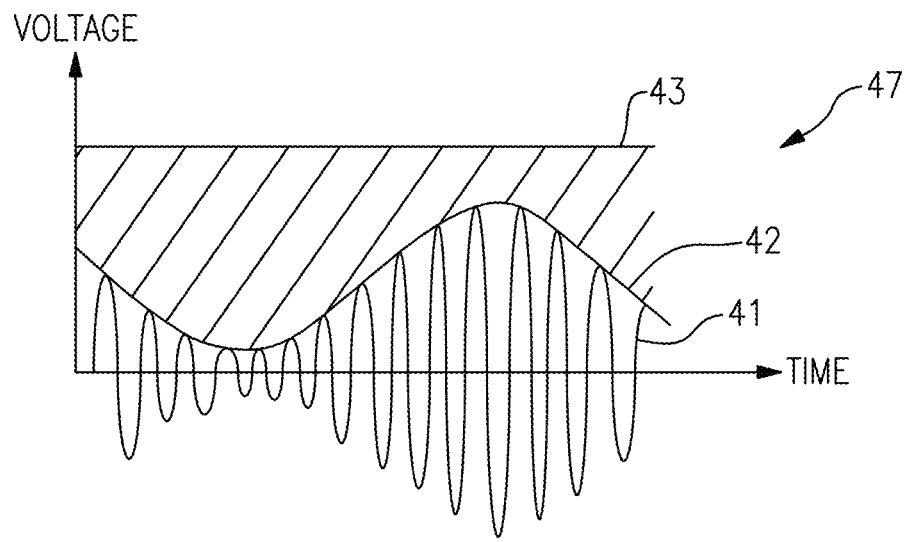
FIGS. 3A-3B show two examples of power amplifier supply voltage versus time.

In FIG. 3A, a graph 47 illustrates one example of the voltage of an RF signal 41 and a power amplifier supply voltage 43 versus time. The RF signal 41 has an envelope 42.

It can be important that the power amplifier supply voltage 43 of a power amplifier has a voltage greater than that of the RF signal 41. For example, powering a power amplifier using a power amplifier supply voltage that has a magnitude less than that of the RF signal can clip the RF signal, thereby creating signal distortion and/or otherwise degrading signal integrity. Thus, it can be important the power amplifier supply voltage 43 be greater than that of the envelope 42. However, it can be desirable to reduce a difference in voltage between the power amplifier supply voltage 43 and the envelope 42 of the RF signal 41, as the area between the power amplifier supply voltage 43 and the envelope 42 can represent lost energy, which can reduce battery life and increase heat generated in a wireless device.

Figure 3B:
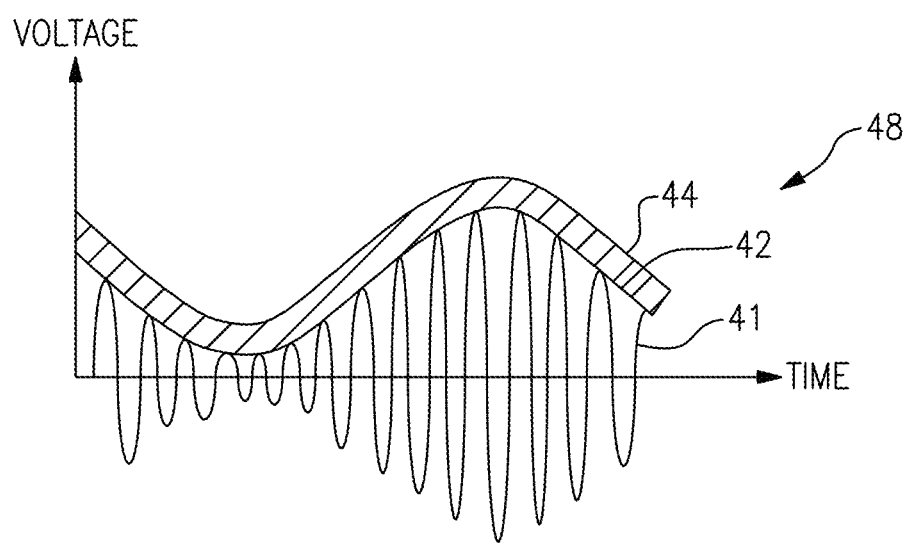

In FIG. 3B, a graph 48 illustrates another example of the voltage of an RF signal 41 and a power amplifier supply voltage 44 versus time. In contrast to the power amplifier supply voltage 43 of FIG. 3A, the power amplifier supply voltage 44 of FIG. 3B changes in relation to the envelope 42 of the RF signal 41. The area between the power amplifier supply voltage 44 and the envelope 42 in FIG. 3B is less than the area between the power amplifier supply voltage 43 and the envelope 42 in FIG. 3A, and thus the graph 48 of FIG. 3B can be associated with a power amplifier system having greater energy efficiency.

II. Power Amplifier Linearization Embodiments

Although it can be useful to use envelope tracking to reduce power consumption of a power amplifier, envelope tracking can introduce nonlinearities to a power amplifier. These nonlinearities can manifest themselves as noise at the output of the power amplifier. Embodiments described herein provide techniques for characterizing a parameter indicative of power amplifier noise when envelope tracking is employed. Techniques for measuring this parameter are described below with respect to FIGS. 7 through 16. Measurement of this parameter can permit power amplifier designers to decide whether to forgo envelope tracking if a power amplifier is too susceptible to such noise, redesign the power amplifier to improve compatibility with envelope tracking, or to employ distortion compensation circuitry to reduce the noise output by the power amplifier. Counterintuitively, this distortion compensation circuitry may involve increasing the power, such as the envelope tracking power supply. However, increasing the power may be a desirable trade-off for increased linearity. Embodiments of such noise compensating circuitry are also described below with respect FIGS. 18 through 21.

Figure 4:
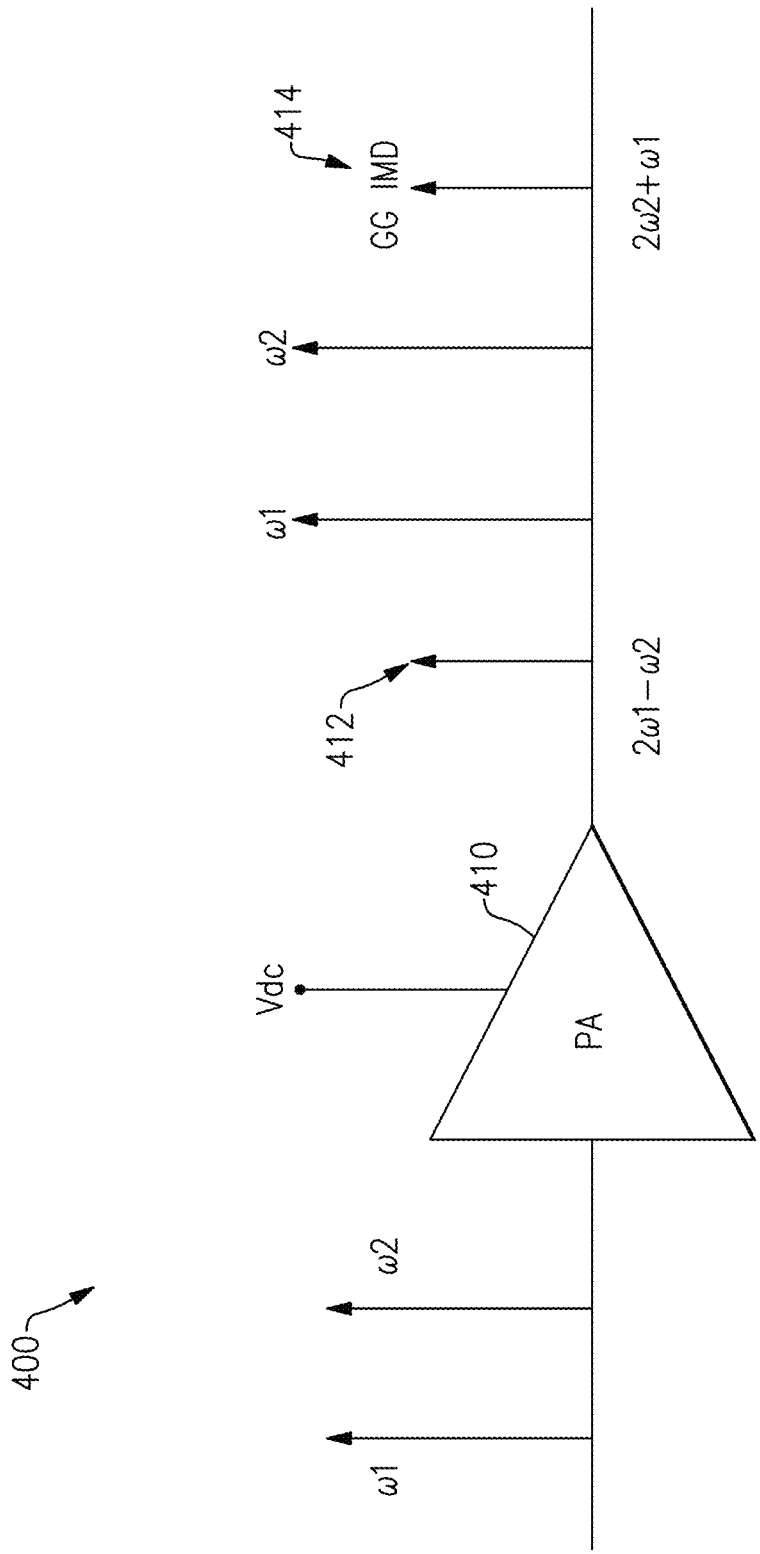
FIGS. 4-6 depict example power amplifiers.

One type of power amplifier noise resulting from envelope tracking is intermodulation distortion. Intermodulation distortion, in addition to having its ordinary meaning, can mean the amplitude modulation of signals containing two or more different frequencies caused by nonlinearities in a system. An example of intermodulation distortion is shown in FIG. 4. In particular, FIG. 4 shows intermodulation distortion of two input signals to the gate of a power amplifier. Intermodulation distortion due to envelope tracking is shown and described below with respect to FIG. 5.

With reference to FIG. 4, two input signals, $\omega 1$ and $\omega 2$, are supplied to the gate of a power amplifier 410. Each of these signals represents a tone or single frequency sinusoid.

The power supply, Vdc, input to the power amplifier 410, is a DC power supply and not an envelope tracker in this example.

A perfectly linear power amplifier with the circuit shown would output solely amplified signals $\omega 1$ and $\omega 2$. However, power amplifiers are typically not perfectly linear. The power amplifier 410 in this example is nonlinear, and instead of merely outputting amplified $\omega 1$ and $\omega 2$ values, also mixes $\omega 1$ and $\omega 2$ to output lower and upper sidebands 412, 414. These lower and upper sidebands 412, 414 are examples of noise due to intermodulation distortion (IMD). Because the two tones $\omega 1$ and $\omega 2$ are input to the gate of the power amplifier 410, this IMD is denoted gate-to-gate IMD, or GG IMD. The frequency of the lower sideband is shown as represented in the FIGURE by $2\omega 1 - \omega 2$, and the upper sideband 414 is shown as represented in the FIGURE by $2\omega 2 + \omega 1$.

The upper and lower sidebands 412, 414 constitute unwanted noise in the output from the power amplifier 410. Although it is possible to design analog or digital filters to remove the noise, it may be desirable also to design the power amplifier 410 to reduce such noise instead of or in addition to adding noise reduction circuitry.

Figure 5:
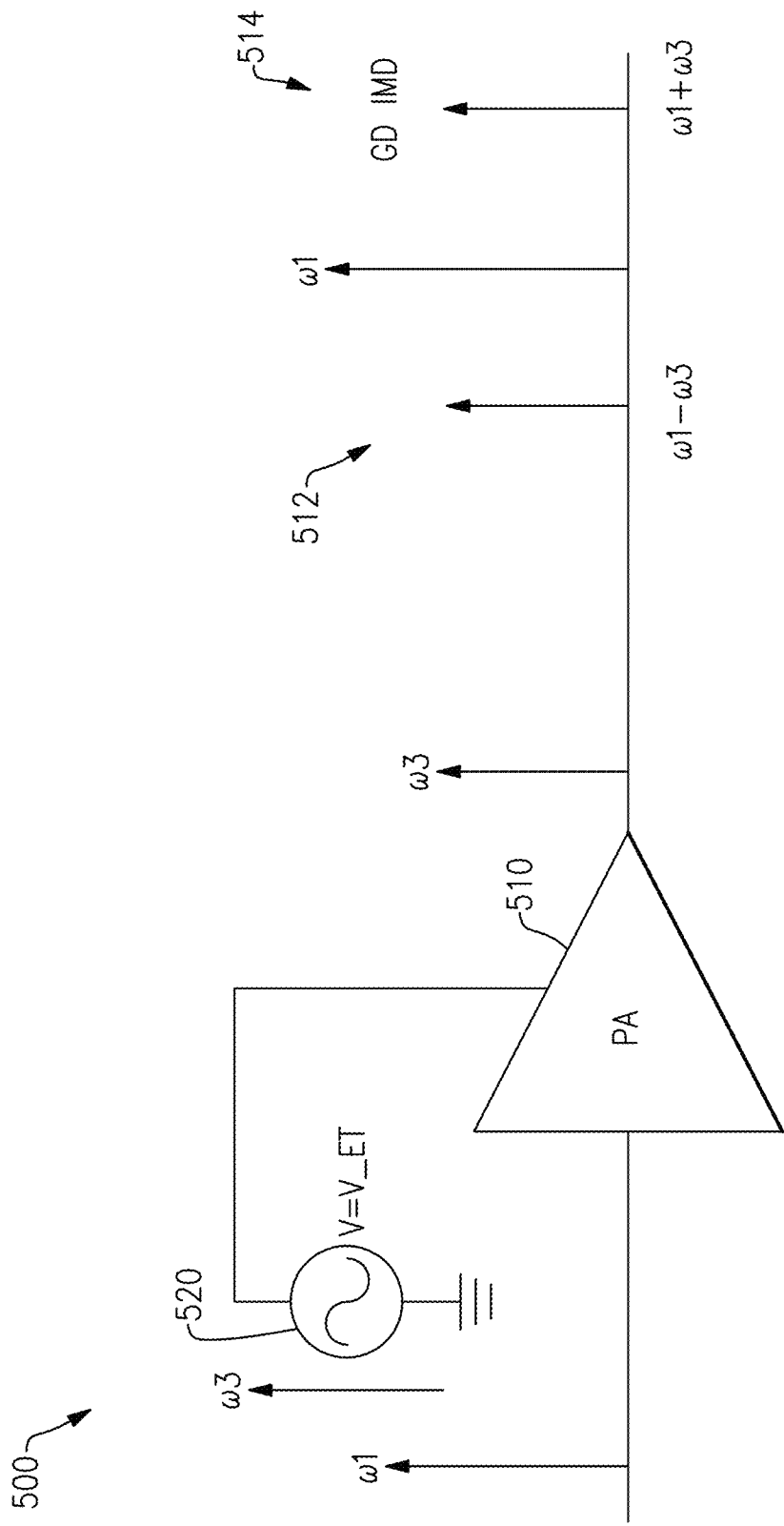

Turning to FIG. 5, another example circuit 500 is shown with a power amplifier 510 and a power supply 520. The power supply 520 is represented as a time-varying power supply with a voltage equal to an envelope tracking voltage. This envelope tracking voltage may be generated by an envelope tracker, such as the envelope tracker 30 described above with respect FIG. 2. In the example circuit 500 shown, the power supply 520 operates at a fixed tone or sinusoidal frequency represented by $\omega 3$. This single frequency illustrates intermodulation distortion generated between the drain of the power amplifier 510, where the power supply voltage enters the power amplifier 510, and the gate of the power amplifier 510. A single tone frequency, $\omega 1$, is shown being input to the gate of the power amplifier 510.

Without IMD, the output of the power amplifier 510 would simply include an amplified version of $\omega 1$ and $\omega 3$ (which are shown at the output). However, due to the power amplifier's 510 nonlinearity, the power amplifier 510 mixes $\omega 1$ and $\omega 3$ to create sidebands 512, 514. The frequencies of each of the sidebands are shown as mathematical representations of the two input frequencies. Because this IMD results from mixing signals from the gate and the drain of the power amplifier 510, this IMD is referred to herein as gate-to-drain IMD, or GD IMD.

Figure 6:
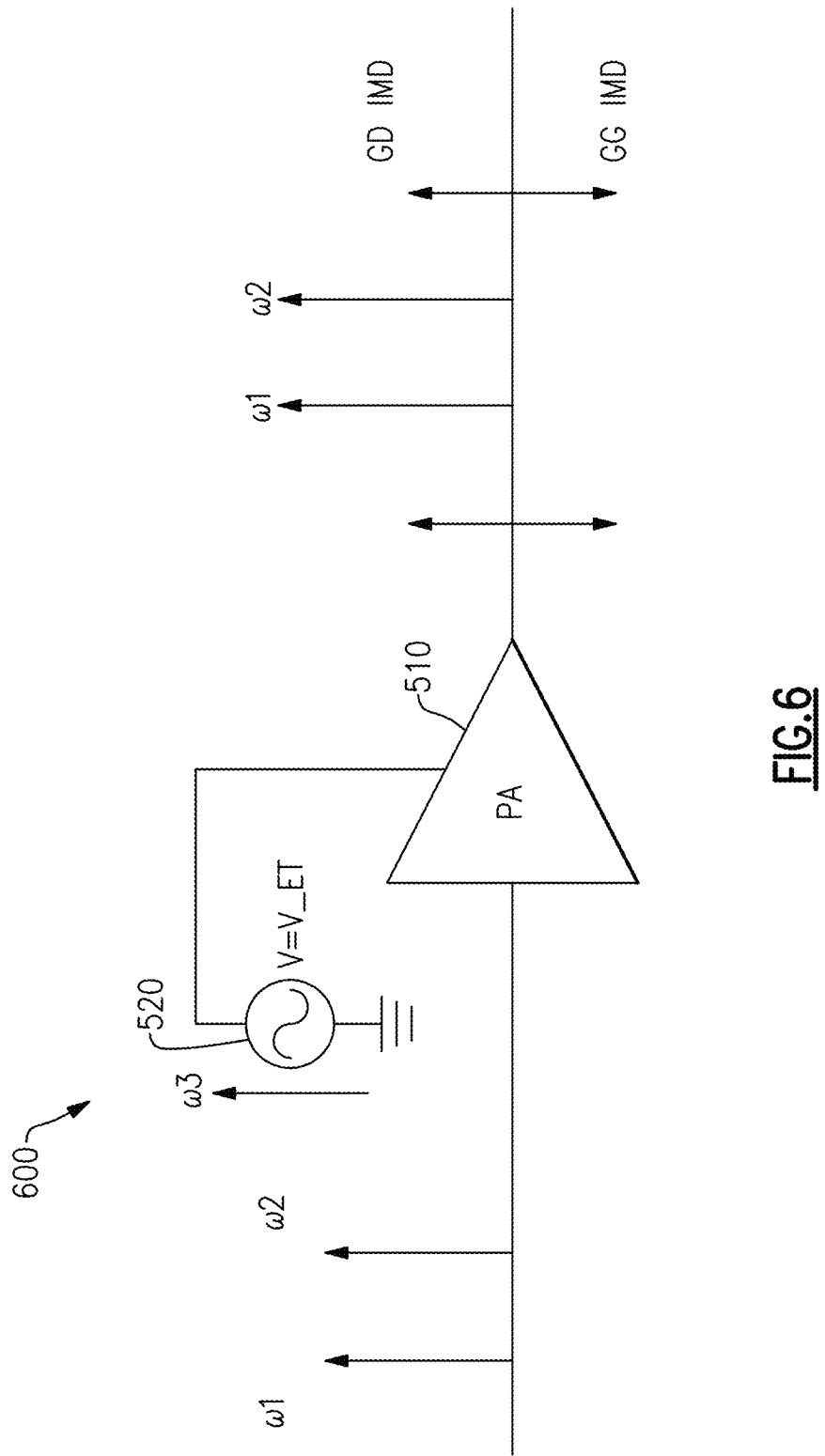

FIG. 6 depicts another circuit 600 similar to the circuit 500, showing the same power amplifier 510 and power supply 520. The difference between FIG. 5 and FIG. 6 is that FIG. 6 adds a second input frequency to the gate, $\omega 2$. Due to nonlinearities in the power amplifier 510, the power amplifier 510 generates both GG IMD and GD IMD, as shown. As an example, the GG IMD and GD IMD shown have the same frequencies, although this may not be the case in some circumstances. In particular, the spectrums of the GG IMD and the GD IMD may overlap when $\omega 3 = \omega 2 - \omega 1$. However, if the GG IMD and GD IMD have the same frequency and opposite phase (180° phase), the GG IMD and GD IMD may act to cancel each other out or otherwise attenuate each other so as to reduce noise due to IMD. If the phase is other than entirely opposite, less than full attenuation or cancellation of the two IMD signals may occur, and if the phase is lower than 90°, enhancement or increase of the IMD can occur.

Figure 7:
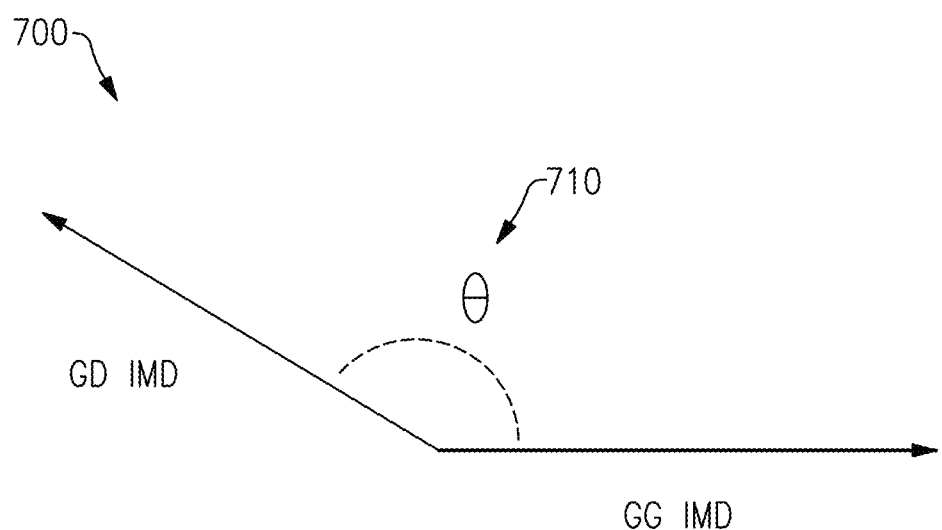

Referring to FIG. 7, a vector representation 700 of the GD IMD and GG IMD are shown. In addition, a phase angle ($\theta$)

710 between GG IMD and GD IMD is shown. This phase angle 710 may be referred to as the IMD phase angle, representing the phase angle between the GG IMD and the GD IMD. This phase angle 710 is often referred to herein as the phase angle or simply "the phase" for convenience. This IMD phase angle 710 can be an inherent characteristic of the power amplifier 510 and may be measured to determine how linear or nonlinear a power amplifier is when envelope tracking is employed. This phase angle 710 may therefore be used as a design parameter when designing or improving the design of a power amplifier for use with envelope tracking. In addition, this phase angle 710 may be used to design noise compensating circuitry to compensate for IMD noise output by a power amplifier.

Referring to FIG. 8, two different general scenarios 810, 820 regarding the IMD phase angle are shown. In each of these scenarios, the GG IMD is represented by vector Vgg, or the voltage of the GG IMD, and the GD IMD is represented by vector Vgd, or the voltage of the GD IMD. Another vector is shown, Vim, the voltage of the total combined IMD due to GD IMD and GG IMD. The vector Vim is shown as a vector addition of Vgd and Vgg. In other words, the vector Vim is the resultant vector of the vector addition, Vgd+Vgg. Although represented as voltage vectors herein, these vectors could instead be represented as current vectors in other embodiments.

Common convention for vector representations includes depicting letters in bold and/or with arrows over the letters. For convenience, this specification dispenses with such convention and refers to both vector quantities and scalar quantities using regular typeface. In some cases, the specification explicitly refers to vectors and scalars (such as magnitudes) for clarity, and elsewhere it should be understood from the context whether the specification is referring to a vector or a scalar quantity.

With continued reference to FIG. 8, the scenario 810 depicts a vector Vim that is smaller than a vector Vim in scenario 820. These two scenarios 810, 820 illustrate that when the IMD phase angle is greater than 90°, noise due to intermodulation distortion may be reduced, and when the IMD phase angle is less than 90°, noise due to IMD may be increased. Thus, the scenario 810 depicts a situation where adding envelope tracking to a power amplifier circuit improved the innate IMD of the power amplifier, and the scenario 820 depicts a situation where adding envelope tracking to a power amplifier worsened IMD.

Figure 9:
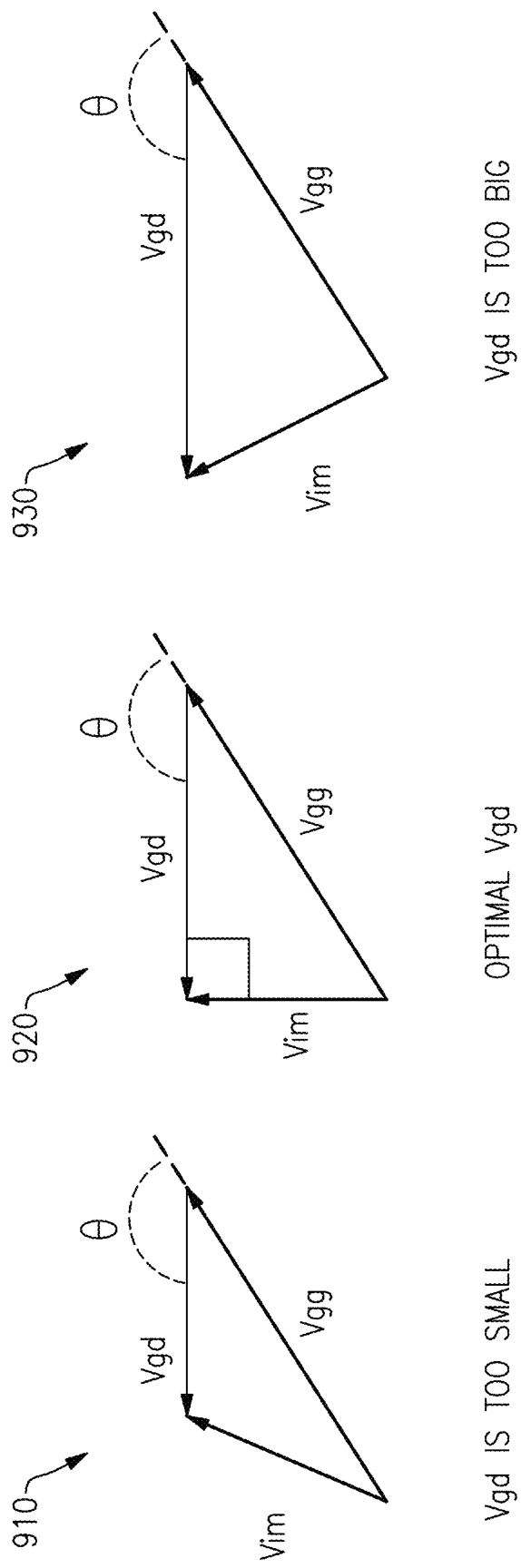

Turning to FIG. 9, additional scenarios 910, 920, and 930 are shown. Each of these scenarios includes the vectors Vgd and Vgg as well as the resultant vector Vim described above with respect FIG. 8. Each scenario 910, 920, and 930 depicts the same IMD phase angle and constant Vgg value but a different Vgd value. In the scenario 920, the vector Vgd has an included angle with the vector Vim that is 90°. It is the magnitude of the vector Vgd that results in this 90° included angle with the vector Vim.

In one embodiment, the magnitude of the vector Vgd that results in the included angle with the vector Vim being 90° is an optimal magnitude of the vector Vgd (all other factors excluded) because the resulting magnitude of the vector Vim may be smallest when the included angle is 90°. In contrast, in the scenario 910, the included angle between Vgd and Vim is greater than 90°, resulting in a larger Vim. Likewise, in the scenario 930, the included angle of Vgd and Vim is less than 90°, resulting in a larger Vim.

Although the magnitude of Vgd resulting in a 90° included angle with Vim may be optimal, due to other design constraints, such a magnitude of this vector Vgd may not be fully realizable and may not actually be optimal. However, an envelope tracker output may be adjusted—amplified or attenuated—to output a power supply voltage that results in a vector Vgd being closer to the optimal scenario 920 than to the scenarios 910 or 930. (Alternatively, Vgg may be amplified or attenuated with a gain in the gate path of the power amplifier to achieve the same 90° included angle without, or in addition to, manipulating Vgd).

The optimal Vgd magnitude may be derived analytically as follows, keeping in mind that an actual implementation of a power amplifier and envelope tracker circuit may vary from these deterministic calculations. The magnitude of Vim may be derived using trigonometry as follows:

$$V_{im} = \sqrt{V_{gg}^2 + V_{gd}^2 + 2V_{gg}V_{gd}\cos\theta}, \quad (1)$$

where θ represents the IMD phase angle.

The minimum IMD can be determined by solving for the partial derivative of Vim with respect to Vgd and setting this equation to 0. Taking the derivative of equation (1) results in:

$$\frac{\partial V_{im}}{\partial V_{gd}} = \frac{V_{gd} + V_{gg}\cos\theta}{2\sqrt{V_{gg}^2 + V_{gd}^2 + 2V_{gg}V_{gd}\cos\theta}}. \quad (2)$$

Then, $$\frac{\partial V_{im}}{\partial V_{gd}} = 0 \quad (3)$$

solving for Vgd results in $$V_{gd} = V_{gg}\cos(108-\theta). \quad (4)$$

Thus, analytically minimizing IMD can be achieved by adjusting Vgd (or alternately, Vgg), which in turn may be obtained by adjusting θ. Further, plugging equation (4) into equation (1), the analytically minimum Vim as a function of IMD phase angle θ can be determined as:

$$V_{im} = V_{gg}\sin\theta. \quad (5)$$

The improvement in IMD, or ΔIMD, representing the ratio of IMD before and after envelope tracking circuitry is employed, may be represented as follows:

$$\Delta(IMD) = 20\log\left(\frac{V_{im}}{V_{gg}}\right) \quad (6)$$
$$= 20\log(\sin\theta), \quad (7)$$

where equation (7) results from plugging equation (5) into (equation 6).

Equation (6) represents a change in IMD from when IMD is due solely to GG IMD (e.g., with DC power supply input and no envelope tracking) to when Vim also includes GD IMD (e.g., when envelope tracking is employed).

FIG. 10 depicts a plot 1000 of equation (7) with respect to IMD angle, θ. Plot trace 1010 depicts a deterministic evaluation of equation (7) for IMD phase angles from 90° to nearly 180° on a decibel scale. As expected, the closer the phase angle is to 180°, the more improvement in IMD occurs.

Two power amplifiers were measured in a simulation (using techniques described below) to determine their ΔIMD. These amplifiers are represented with ΔIMD values 1012, 1014 in FIG. 10. As shown, the measured ΔIMD values for these amplifiers are highly correlated with their analytical solution. The plot 1000 therefore indicates that IMD improvement can easily be estimated from the IMD phase angle before any envelope tracker circuit design in hardware. Table 1 below sets forth the IMD phase angle and ΔIMD for these 2 amplifiers:

TABLE 1

| Power Amplifier | IMD Phase Angle | ΔIMD (3 Tone Simulation) |
| --- | --- | --- |
| PA1 | 154° | −7 dBc |
| PA2 | 175° | −21 dBc |

Figure 11A:
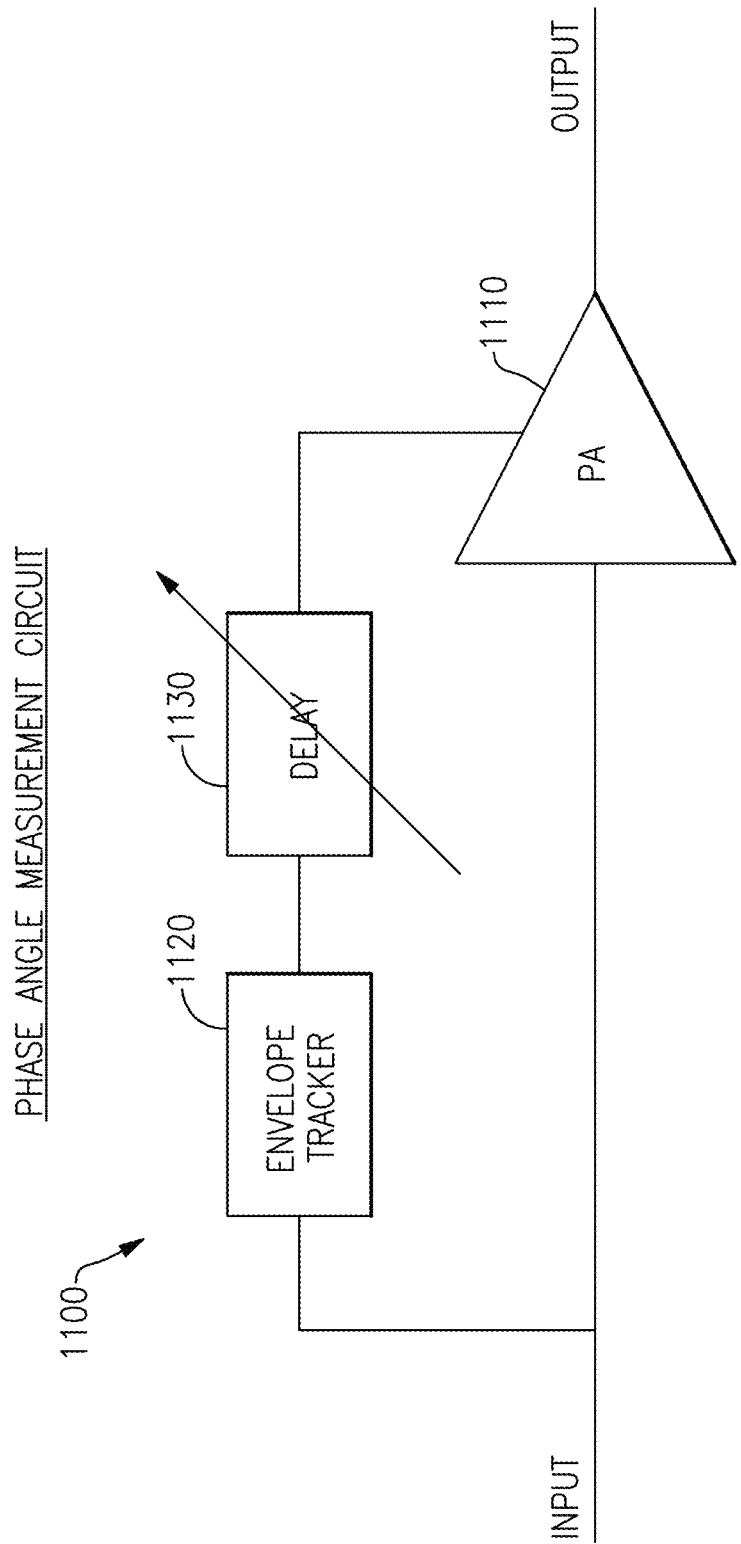
FIGS. 11A and 11B depict example phase angle measurement circuits.

Turning to FIG. 11A, an example phase angle measurement circuit 1100 is shown. The circuit 1100 can be used to measure the IMD phase angle of a power amplifier 1110. The circuit 1100 includes, in addition to the power amplifier 1110, an envelope tracker 1120 and a delay circuit 1130.

An input signal is applied to both the envelope tracker 1120 and the power amplifier 1110. For the purposes of determining the IMD phase angle, this input signal can include two tones, ω1 and ω2. The envelope tracker 1120 can output an envelope tracking signal ω3 that tracks the envelope of the two input tones. The value of ω3 may be set to ω3=ω2−ω1 to cause GD IMD to overlap with GG IMD. The output of the envelope tracker 1120 is supplied to the delay circuit 1130. The delay circuit 1130 can be a variable delay circuit that applies a phase delay (or equivalent time delay) to the output of the envelope tracker 1120. The output of the delay circuit 1130 is provided as a supply voltage to the power amplifier 1110. The power amplifier 1110 provides an output signal.

The phase of the delay circuit 1130 may be adjusted to result in different outputs from the power amplifier 1110. Certain values of the phase delay of the delay circuit 1130 result in lower values of IMD output by the power amplifier 1110. One or more of these lower or minimum values of IMD may be measured. Since equation (5) represents a minimization of IMD and includes the IMD phase angle, the IMD phase angle may be calculated based on this minimum IMD measurement, as described below with respect FIGS. 12 through 16.

Figure 11B:
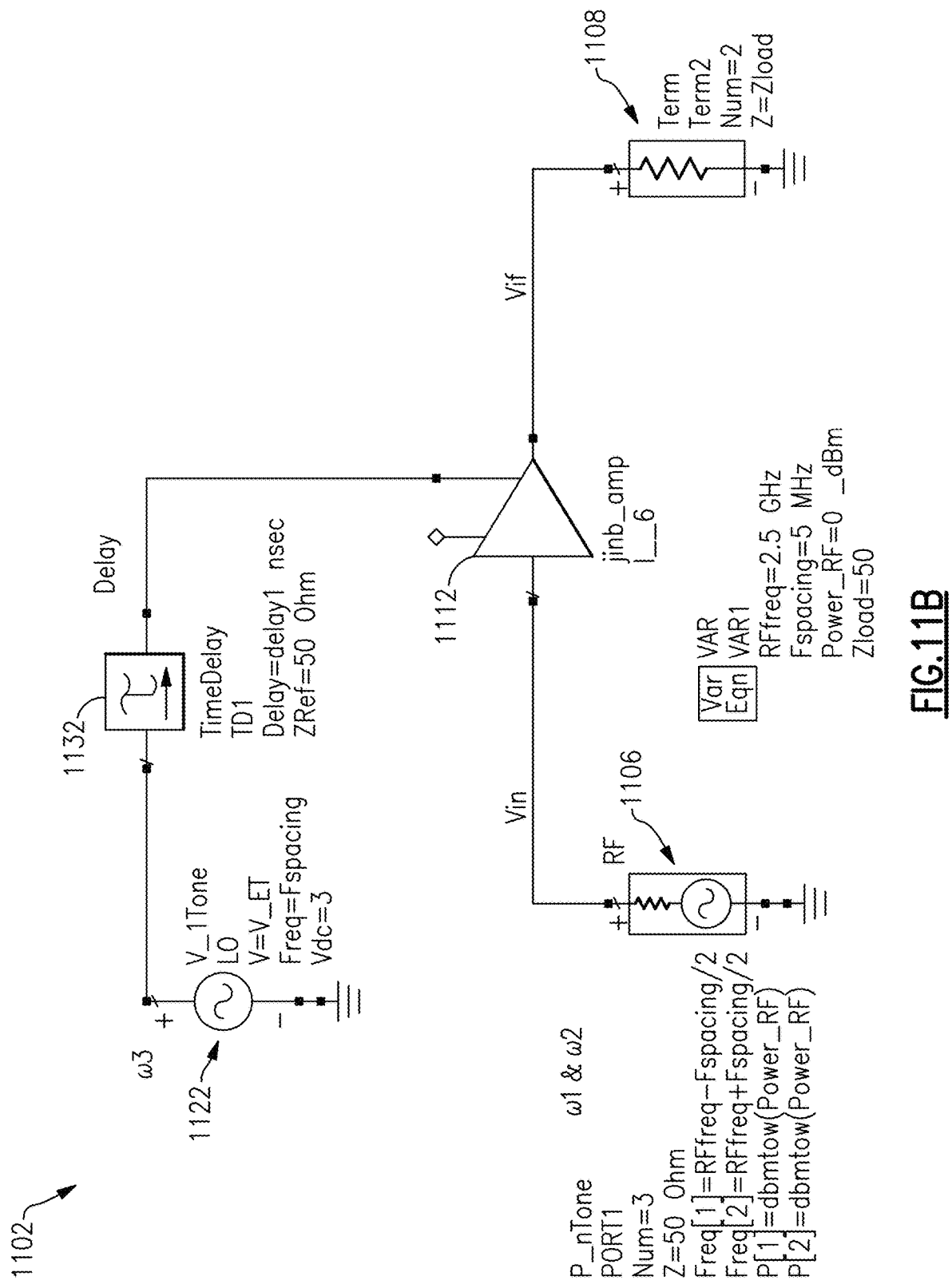

Before describing example IMD phase angle measurement techniques, another example phase angle measurement circuit 1102 will be described, as shown in FIG. 11B. The circuit 1102 represents a Spice™ simulation of the conceptual circuit 1100 shown in FIG. 11A. Two tones, ω1 and ω2, are supplied by voltage generator 1106 to a power amplifier 1112. An envelope tracking voltage signal ω3 is supplied by a voltage generator or envelope tracker 1122 to a delay circuit 1132. The value of ω3 is set to ω3=ω2−ω1 to cause GD IMD to overlap with GG IMD. The delay circuit 1132 provides a supply voltage to power amplifier 1112 and may be varied as described above with respect to FIG. 11A to facilitate measurement of the IMD phase angle. A load resistor 1108 in communication with an output of the power amplifier 1112 is used to measure voltage at the output of the power amplifier 1112.

Figure 12:
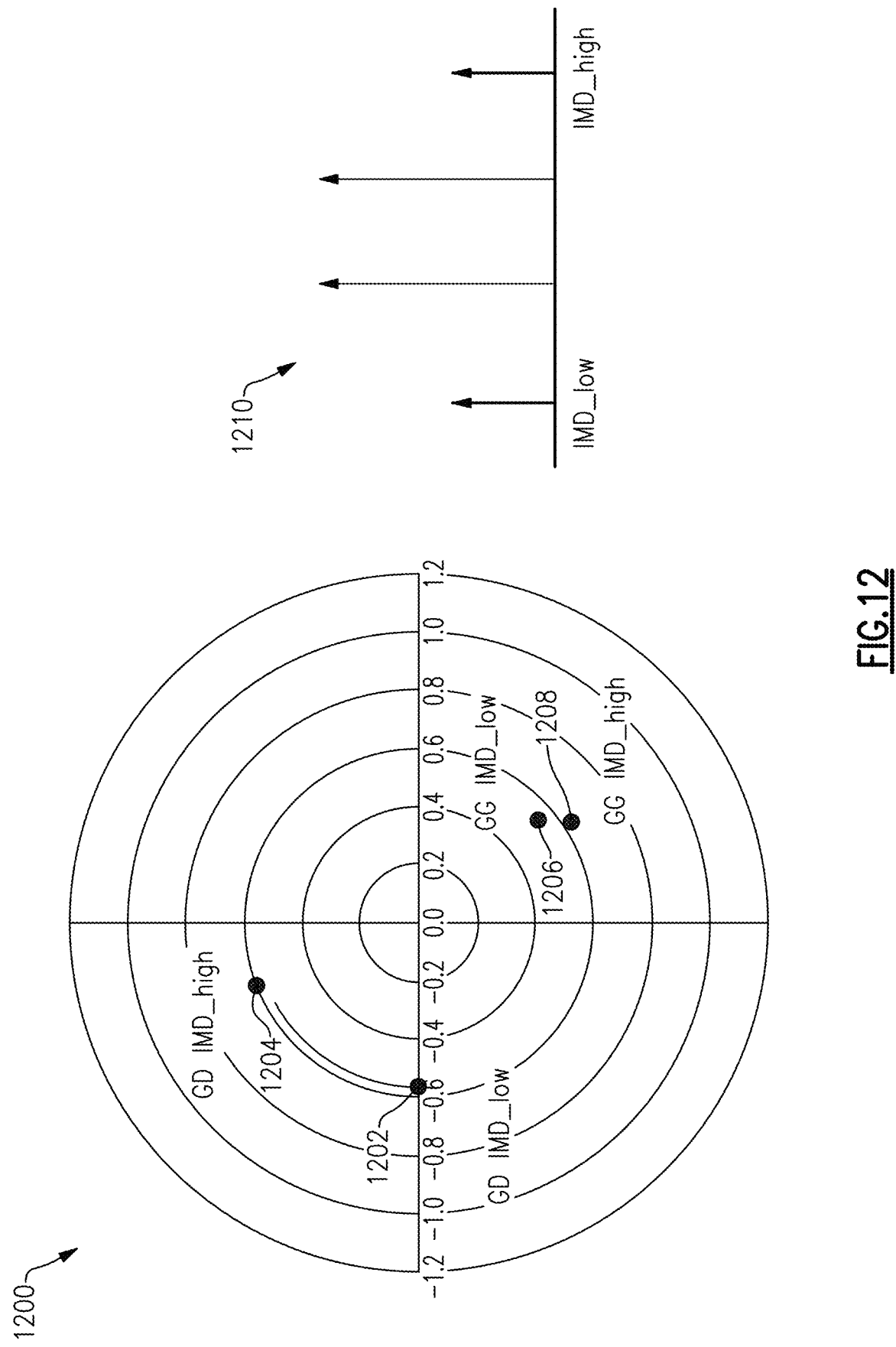
FIGS. 12-15 depict example IMD measurement plots.

Referring now to FIG. 12, an example phase angle plot 1200 is shown generated based on the simulation circuit 1102 shown in FIG. 11B. The phase plot 1200 depicts various IMD values as vectors, represented by dots instead of vector lines. Circles in the plot indicate magnitude that is constant at any point on each circle. An angle (not shown) between each IMD vector with respect to the abscissa of the plot 1200 represents a phase angle of that IMD vector, which is not to be confused with the IMD phase angle between GD IMD and GG IMD.

As described above and shown for reference in magnitude plot 1210, IMD resulting from both GG IMD and GD IMD results in both lower and upper sidebands. The lower sideband is referred to as IMD_low, and the upper sideband is referred to as IMD_high in the magnitude plot 1210. Both GG IMD and GG IMD have low and high sidebands. The vector of each sideband is represented by the dots in the plot 1200, including dots 1202, 1204, 1206, and 1208.

Figure 13:
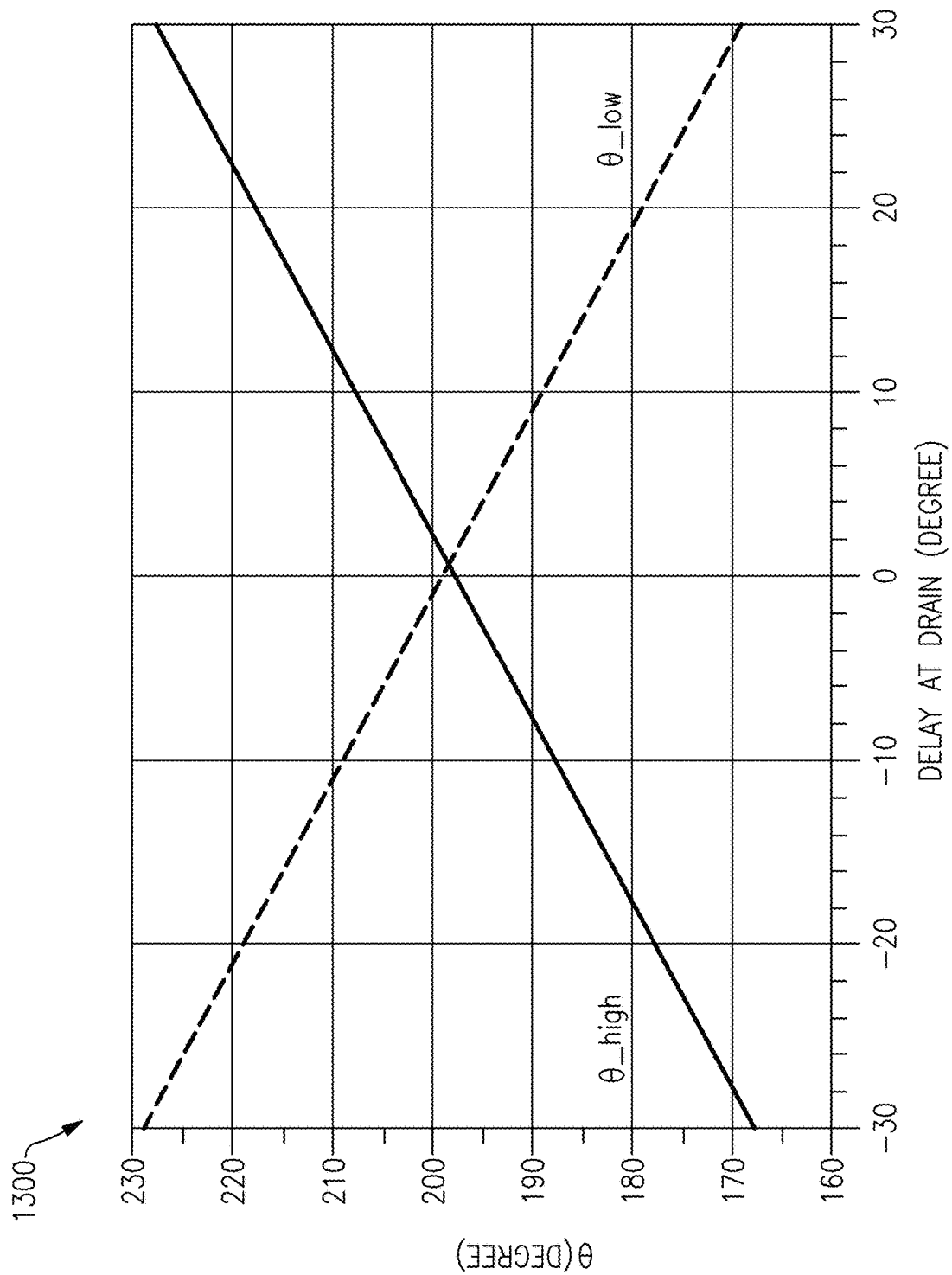

In one example simulation, the values of GG IMD_low and GG IMD_high 1206, 1208 are constant. Due to the delay circuit 1132 in the path of the envelope tracker 1122, the values of GD IMD_low and GD IMD_high 1202, 1204 can change. As the phase value of the delay circuit 1132 changes, GG IMD_low and GD IMG_high change in opposite directions, approaching each other. Likewise, the IMD phase angle between GD IMD_low and GG IMD_low changes in an opposite manner as the IMD phase angle between GD IMD_high and GG IMD_high. A plot 1300 of these opposite-changing phases is shown in FIG. 13. The plot 1300 graphs the delay at the drain caused by the delay circuit 1132 with respect to the IMD phase angles θ_low and θ_high for low and high sidebands, respectively (in degrees).

Figure 14:
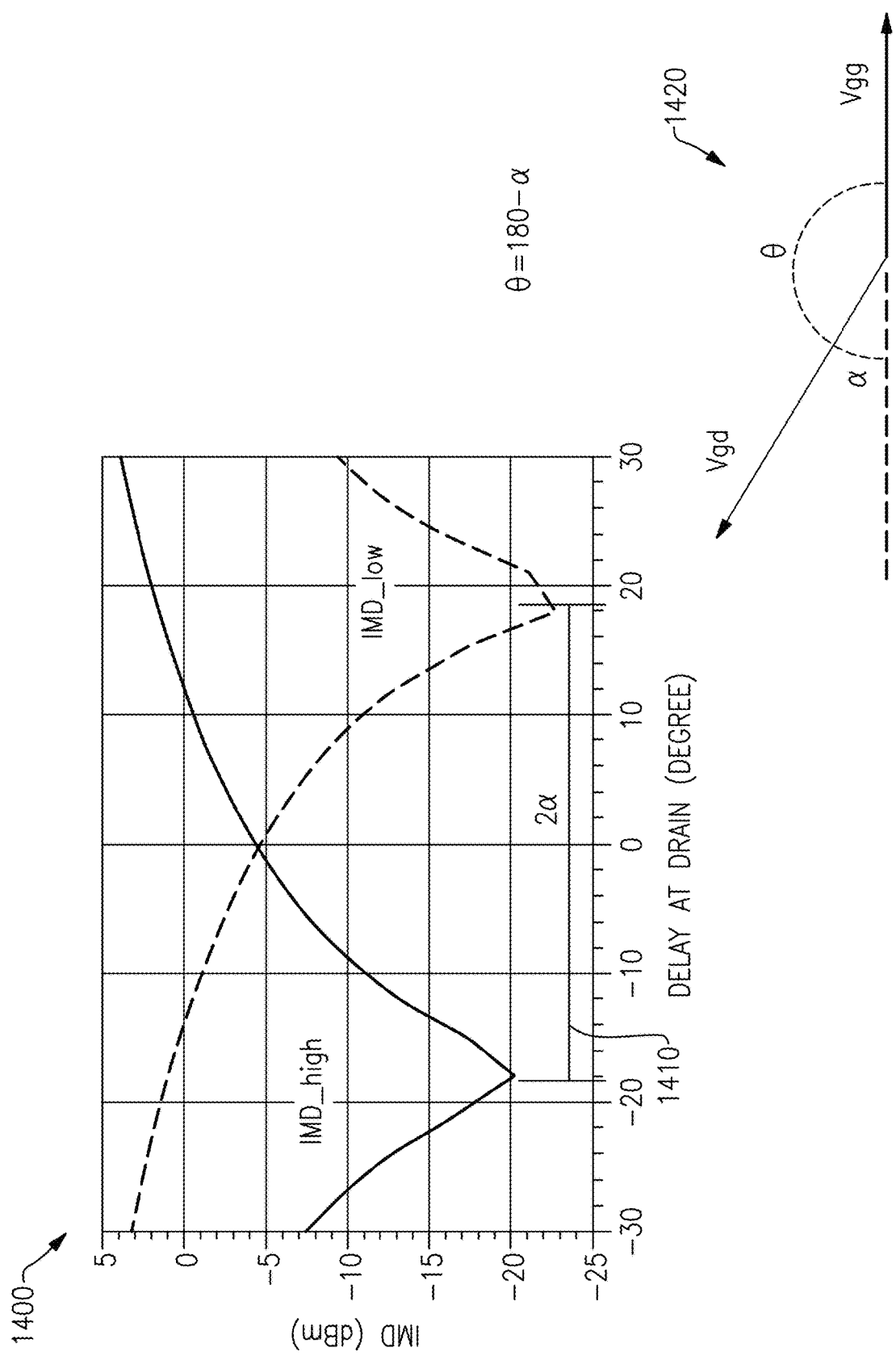

FIG. 14 depicts a plot 1400 of IMD_low and IMD_high versus the delay of the drain (in degrees). IMD_low represents the combined magnitude of GG IMD_low and GD IMD_low, and IMD_high represents the combined magnitude of GG IMD_high and GD IMD_high. As shown, both IMD sidebands reach a minimum at different phase angles of the delay at the drain caused by the delay circuit 1132. An example plot 1420 of the vectors Vgd and Vgg is also shown in FIG. 14. As shown in the plot 1420, a value of the IMD phase angle θ may be represented as θ=180°−α, where α is shown in the plot 1420. The angle α represents a phase quantity that would be required to move the IMD phase angle θ to 180°. Thus, adding a delay equivalent to a should minimize either IMD_low or IMD_high (analytically; in practice, some additional tweaking may be required).

The value of the phase delay applied by the delay circuit 1132 may be varied in a positive direction until IMD_low is minimized. The value of this phase delay may then be varied in a negative direction until IMD_high is minimized. The difference in phase delay between where IMD_low and IMD_high are minimized is equal to 2α. Thus, the value of α may be derived as half of this value, and then the value of the IMD phase angle θ may be obtained from the equation θ=180°−α.

Figure 15:
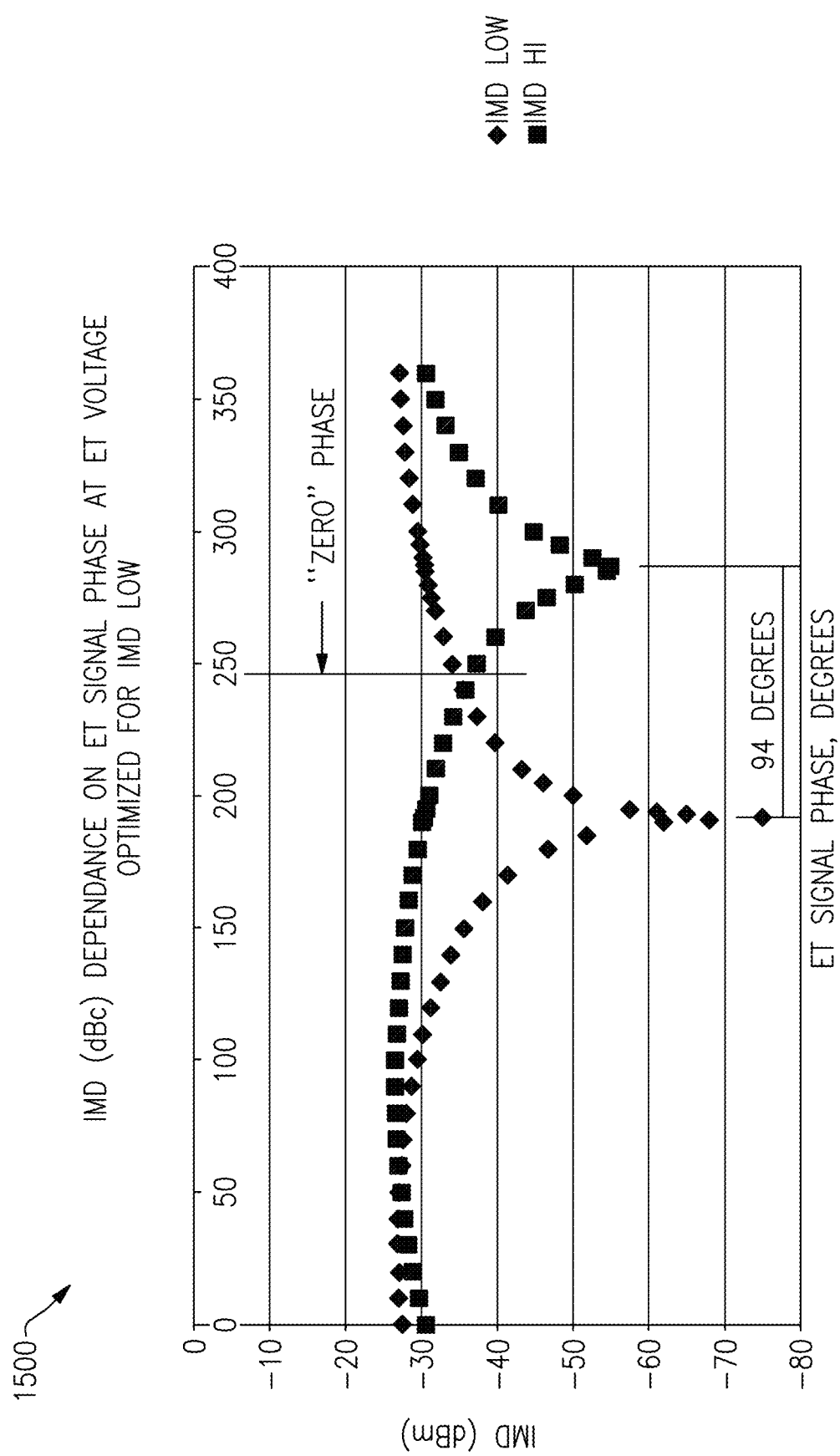

FIG. 15 depicts a plot 1500, similar to the plot 1400, of a simulation using the circuit 1102 shown in FIG. 11B. The plot 1500 graphs IMD_low versus IMG_high. A value of the phase angle 2α is shown, 94°. The resulting IMD phase angle value is 180°−94°/2=133°. In certain embodiments, there is an offset between the phase difference and the adjustable phase delay in ET phase. As shown in FIG. 15, 250 degree of ET phase delay corresponds to the 0 phase difference. It is therefore more accurate in certain embodiments to measure the two IMD minimums and derive α from 2α than trying to calculate a directly from a delay of 0 (e.g., as may be expected is possible from FIG. 14). However, in other embodiments, a is calculated directly from a delay of 0.

Figure 16:
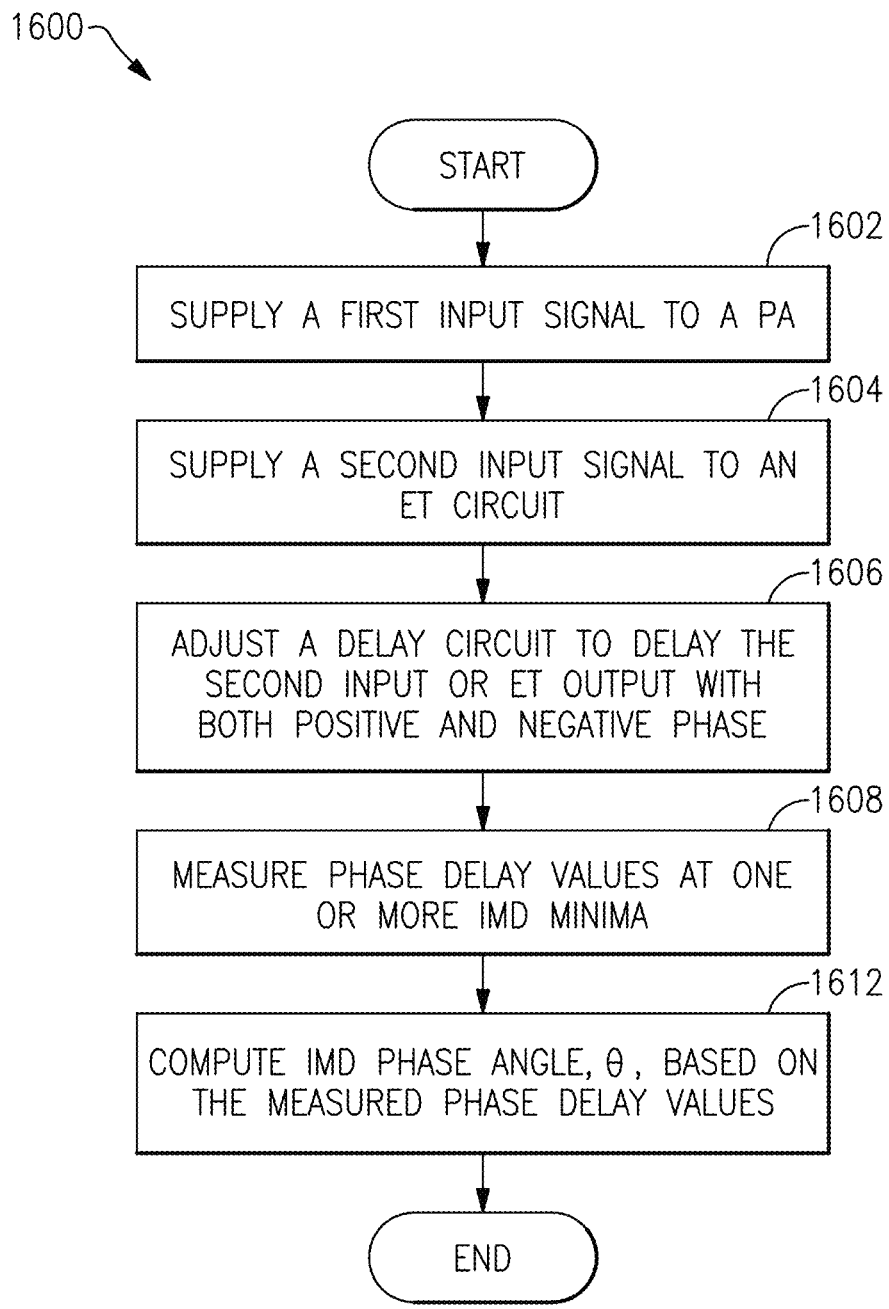
FIG. 16 depicts an example IMD phase angle measurement process.

FIG. 16 depicts an example IMD phase angle measurement process 1600. The phase angle measurement process 1600 may be implemented by the circuit 1100 or 1102 shown in FIGS. 11A and 11B. At block 1602, a first input signal is supplied to a power amplifier (PA). At block 1604, a second input signal is applied to an envelope tracker (ET) circuit.

At block 1606, a delay circuit is adjusted to delay the second input signal or the ET output with both positive and negative phase. Thus, the delay circuit 1130 or 1132 could be between the input path in the gate of the power amplifier 1110, 1112 instead of in the ET path.

At block 1608, the phase values of the delay are measured at one or more IMD minima, for example as in FIG. 14 or 15. The IMD phase angle is computed at block 1612 based on the measured phase delay values using, for example, the equation shown in FIG. 14.

Figure 17:
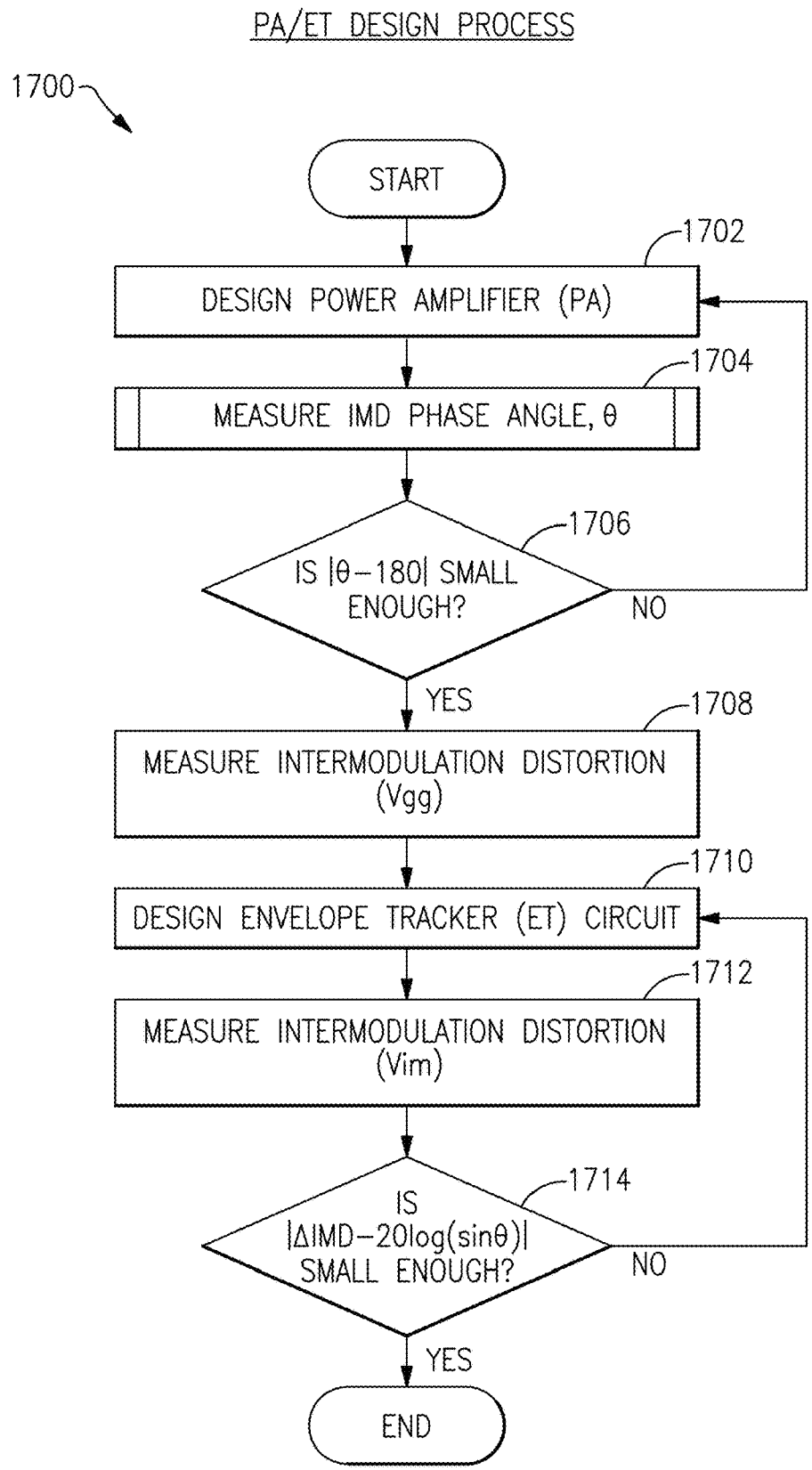
FIG. 17 depicts an example design process.

FIG. 17 depicts an example PA/ET design process 1700. At block 1702, a power amplifier may be designed (or selected off-the-shelf for analysis). The IMD phase angle is measured at block 1704, using, for example, the process 1600 of FIG. 16. A decision block 1706, it is determined whether $|\theta-180°|$ is small enough to indicate sufficient linearity of the power amplifier. Values of $\theta$ greater than 90° may result in the quantity $|\theta-180°|$ being small enough to reduce IMD noise (see FIG. 8). However, even larger values of $\theta$ (for example, closer to 180° instead of 90°) may be desired for some applications that are less tolerant of IMD noise. If the quantity $|\theta-180°|$ is too large, then the process 1700 loops back to block 1702, where the power amplifier may be redesigned or where a different power amplifier may be selected for analysis.

At block 1708, IMD is measured (Vgg) prior to envelope tracking being applied. At block 1710, an envelope tracker circuit is designed or otherwise selected for inclusion with the power amplifier. At block 1712, IMD is again measured (Vim). At decision block 1714, it is determined whether $|\Delta IMD-20\log(\sin\theta)|$ is small enough, where $\Delta IMD$ may be calculated as $20\log(Vim/Vgg)$. If this quantity is small enough, then the ET circuit may add a sufficiently small amount of IMD, or even improve IMD, to permit usage of ET for a given application. If not, the process 1700 proceeds back to block 1710 to redesign the envelope tracker circuit or select a new ET circuit. Such redesign may entail incorporating distortion compensation circuitry to the envelope tracker or power amplifier circuit.

Figure 18:
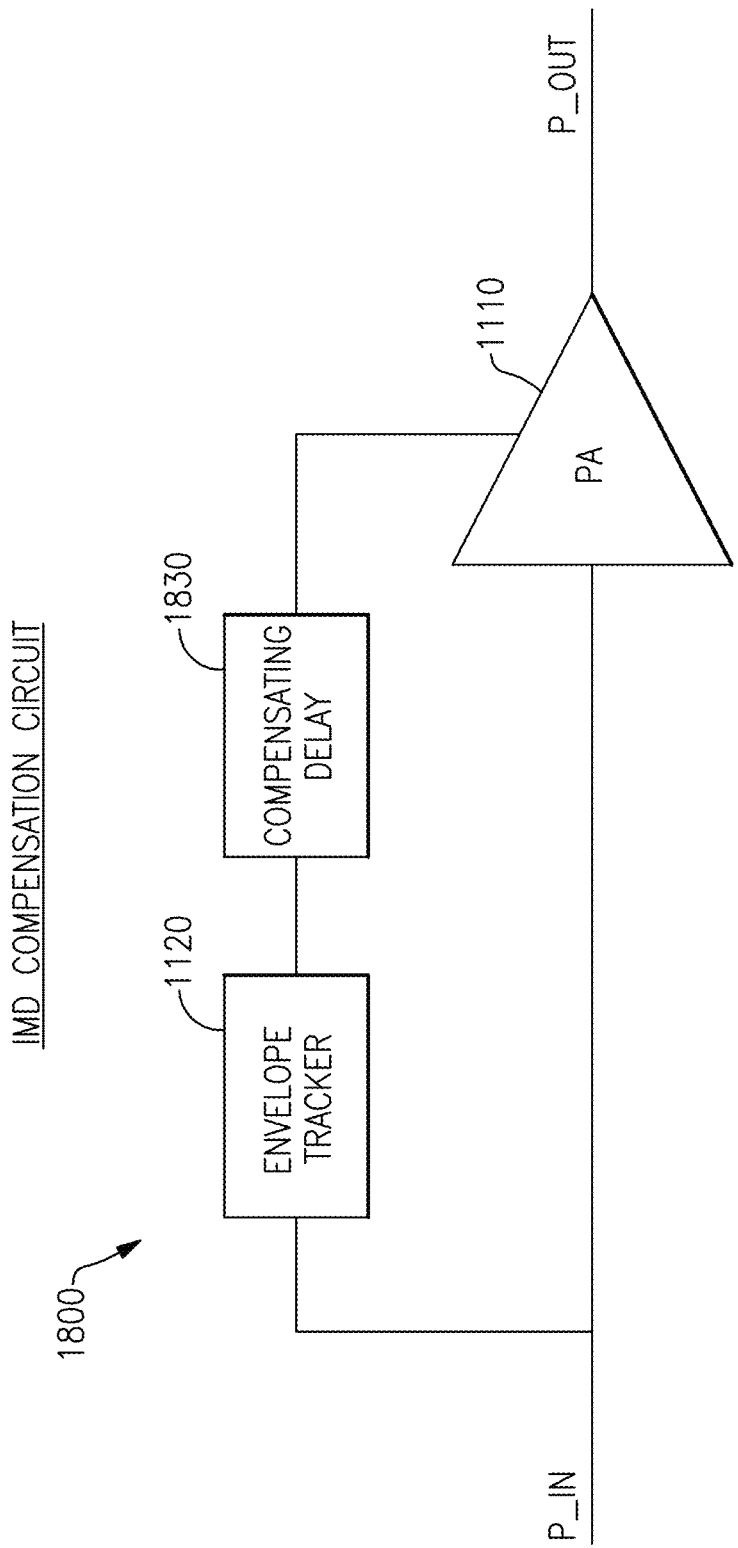
FIGS. 18-21 depict example distortion compensation circuits.

FIGS. 18 through 21 depict example IMD/distortion compensation circuits (or more generally, noise compensation circuits). Various characteristics of each of these circuits may be combined to produce a different circuit than shown, as will be described below. In FIG. 18, an example circuit 1800 includes the envelope tracker 1120, a compensating delay circuit 1830, and the power amplifier 1110. If the power amplifier 1110 and/or envelope tracker 1120 are found to provide insufficient IMD noise reduction characteristics, such as a poor IMD phase angle or poor value of $\omega 3$, compensating delay circuit 1830 can provide a phase delay (or equivalent time delay). This phase or time delay can reduce IMD in a similar manner to the delay circuit 1130, 1132 used to measure IMD. For example, the phase delay value of the compensating delay circuit 1830 can be selected analytically and/or adjusted experimentally until IMD is reduced or even minimized.

Figure 19:
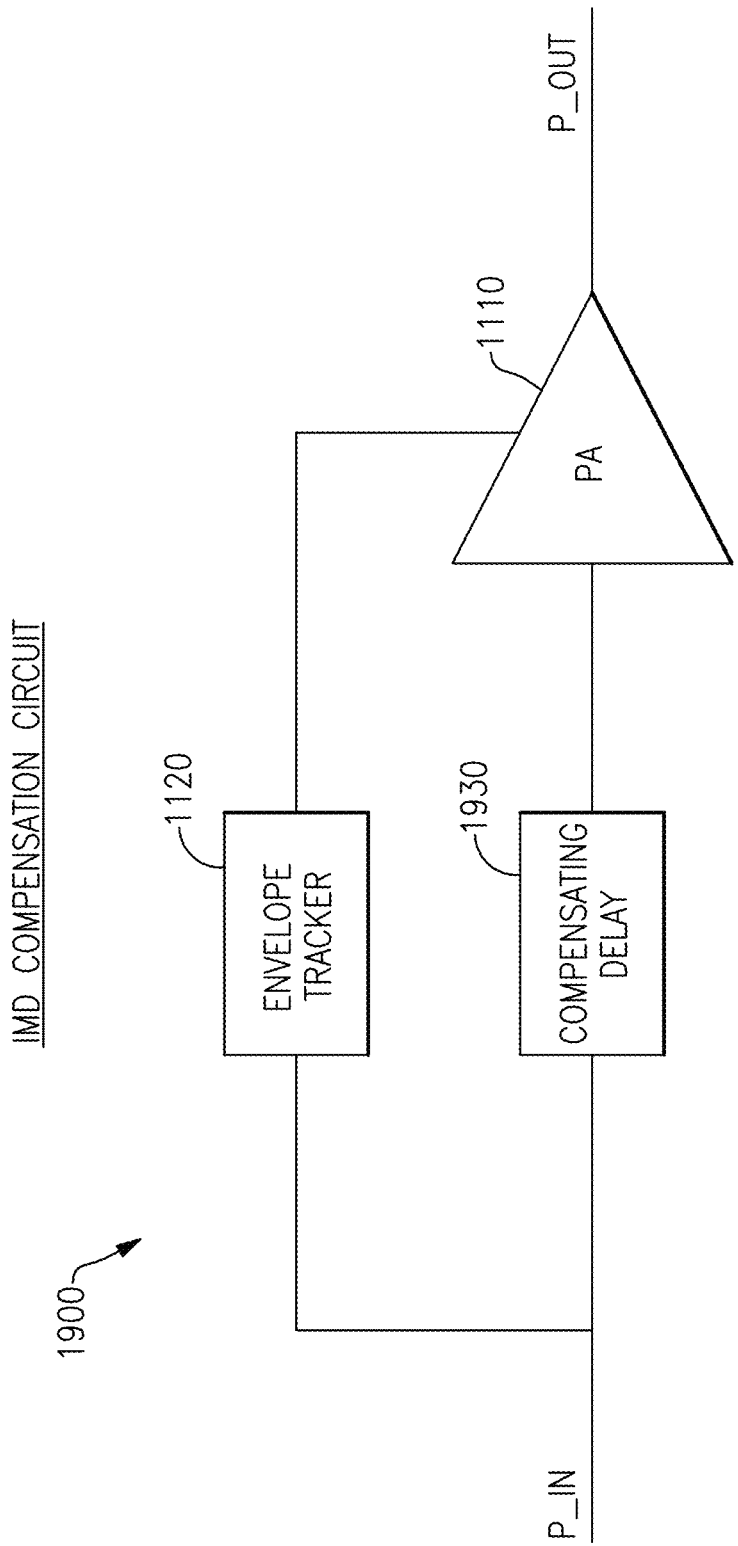

FIG. 19 depicts another circuit 1900, similar to the circuit 1800, except that the compensating delay 1930 is in the gate path to the power amplifier 1110 instead of the drain path. The compensating delay 1930 may have a value selected as described above with respect FIG. 18.

Figure 20:
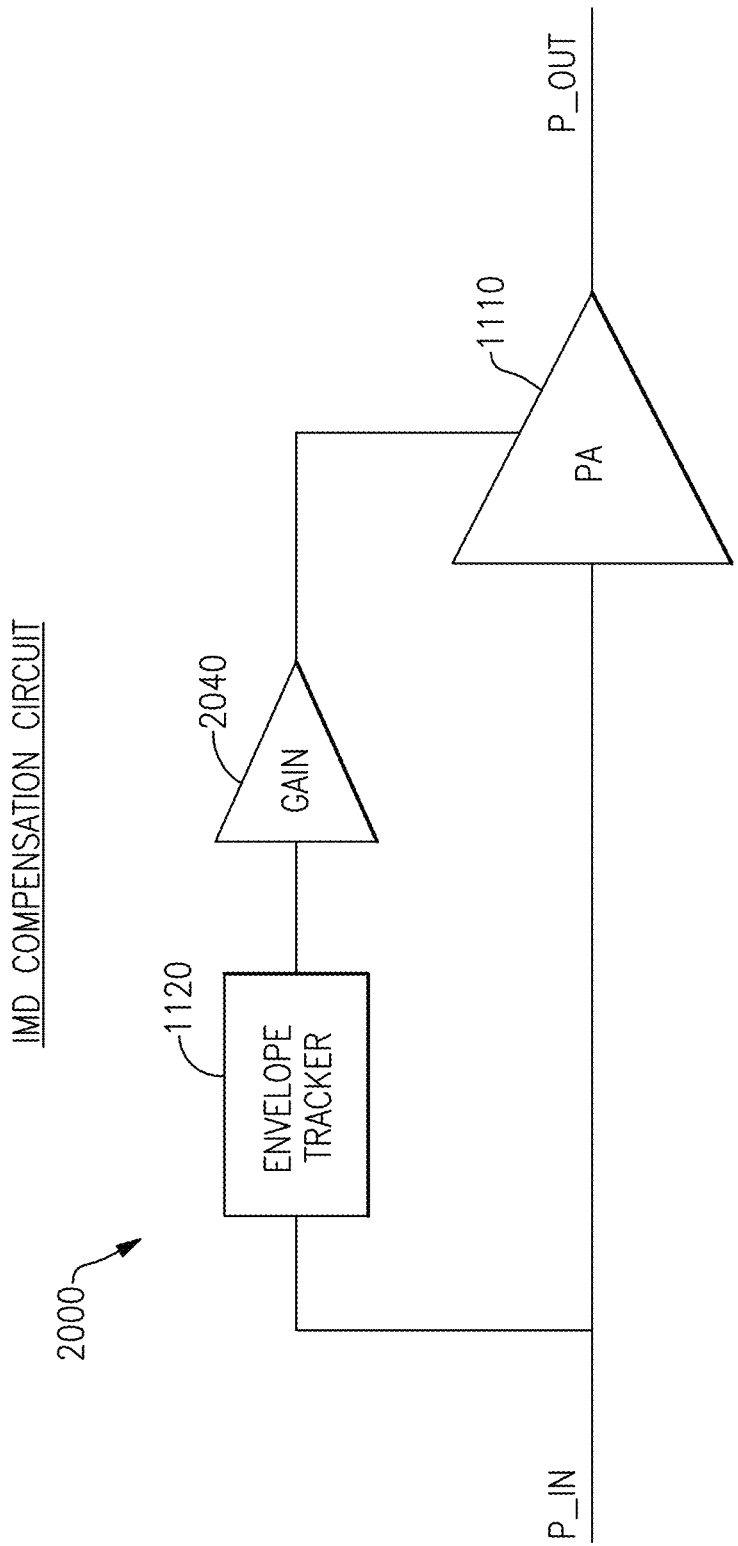

FIG. 20 depicts another circuit 2000 with a compensating gain value 2040 instead of a compensating delay. As described above with respect FIG. 9, adjusting the gain of the envelope tracker, including even increasing the gain in some instances, can be done to reduce IMD noise and improve power amplifier linearity. Thus, the compensating gain 2040 can adjust the gain of envelope tracker output to reduce IMD. The value of the compensating gain 2040 may be calculated analytically and/or may be selected experimentally.

For example, referring to FIG. 4, the following equations may be derived, considering RF-RF IMD phase difference:

$\tfrac{3}{4}g_{m3}v_i^3 \cos[(2\omega_1-\omega_2)t]$ (Corresponding to line 412)

$g_m v_i \cos(\omega_1 t)$ (Corresponding to line $\omega 1$)

$g_m v_i \cos(\omega_2 t)$ (Corresponding to line $\omega 2$)

$\tfrac{3}{4}g_{m3}v_i^3 \cos[(2\omega_2-\omega_1)t]$ where $g_m$ is transconductance, $g_{m3}$ is the second derivative of $g_m$, and $g_d$ (shown below) is output conductance.

Referring to FIG. 5, the following equations may be derived, considering ET-RF IMD phase difference:

$\tfrac{1}{2}g_d g_m v_e v_i \cos[(\omega_1-\omega_3)t]$ (corresponding to 512)

$g_m v_i \cos(\omega_1 t)$ (corresponding to $\omega 1$)

$\tfrac{1}{2}g_d g_m v_e v_i \cos[(\omega_1+\omega_3)t]$ (corresponding to 514, as considered to be ET-RF IMD)

Cancellation between RF-RF and ET-RF IMDs can be derived as follows:

$$V_{gd} = V_{gg}\cos(180-\theta) \quad \text{(derived above)}$$

$$V_{gd} = \frac{1}{2}g_d g_m v_e v_i$$

$$V_{gg} = \frac{3}{4}g_{m3}v_i^3$$

$$v_e = \frac{3g_{m3}v_i^2}{2g_d g_m}\cos(180-\theta)$$

where $v_e$ is the ET signal and $v_i$ is the RF signal.

Figure 21:
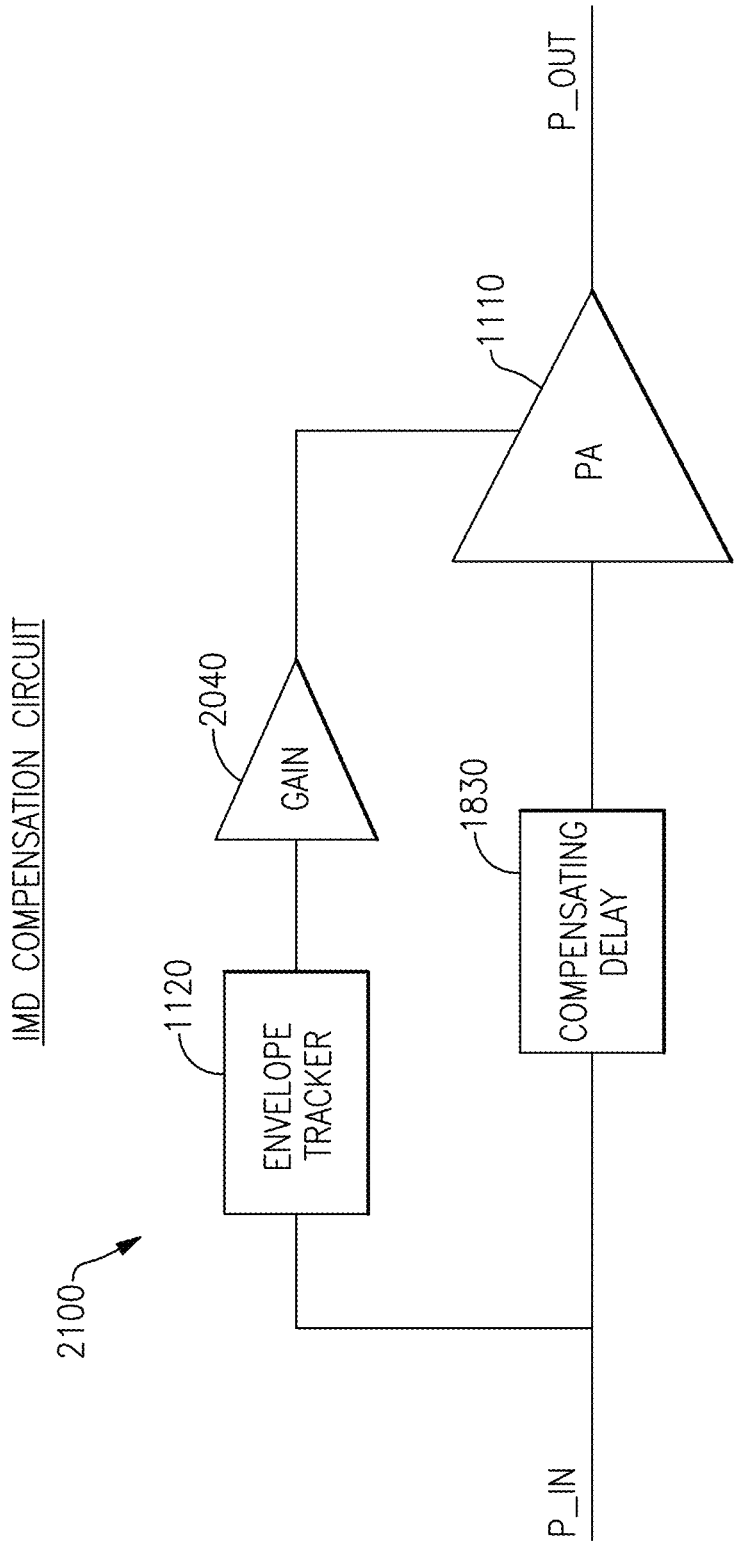

FIG. 21 depicts another example circuit 2100 having both a compensating gain 2040 and a compensating delay 1830. The compensating delay 1830 is shown in the gate path, and the compensating gain 2040 is shown of the delay path. These positions may be reversed. Further, in other embodiments, a compensating delay may be included in both the gate path and in the drain path. Likewise, a compensating gain may be included in both the gain path and the drain path. Other configurations are possible.

III. Applications

Some of the embodiments described above have provided examples in connection with wireless devices or mobile phones. However, the principles and advantages of the embodiments can be used for any other systems or apparatus that have needs for envelope trackers.

Such envelope trackers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

IV. Terminology

The headings provided herein, if any, are for convenience only and do not necessarily affect the scope or meaning of the claimed inventions.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

The above detailed description of embodiments of the inventions is not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
a power amplifier having a signal input path and a power input path;
an envelope tracker configured to provide a power supply voltage to the power amplifier through the power input path; and
a distortion compensation circuit including a gain circuit configured to apply a gain value that is selected to compensate for intermodulation distortion associated with an intermodulation phase angle, the intermodulation distortion due to the power amplifier mixing the power supply voltage with an input to the power amplifier.

2. The power amplifier system of claim 1, wherein the distortion compensation circuit is disposed in the power input path.

3. The power amplifier system of claim 1, wherein the gain value is selected based on measured intermodulation phase angle.

4. The power amplifier system of claim 1 wherein the distortion compensation circuit further includes a delay circuit configured to apply a delay value that is selected to compensate for the intermodulation distortion.

5. The power amplifier system of claim 4 wherein the delay value is selected based on measured intermodulation phase angle.

6. The power amplifier system of claim 4, wherein the delay circuit is in the power input path.

7. The power amplifier system of claim 4, wherein the delay circuit is in the signal input path.

8. An power amplifier system comprising:
a power amplifier having a signal input path and a power input path;

an envelope tracker configured to provide a power supply voltage to the power amplifier through the power input path; and a distortion compensation circuit including a delay circuit configured to apply a delay value that is selected to compensate for intermodulation distortion associated with the intermodulation phase angle, the intermodulation distortion due to the power amplifier mixing the power supply voltage with an input to the power amplifier.

9. The power amplifier system of claim 8 wherein the delay value is selected based on measured intermodulation phase angle.

10. The power amplifier system of claim 8 wherein distortion compensation circuit is disposed in the power input path.

11. A method of operating a power amplifier, the method comprising:

providing a first input signal to a signal input path of the power amplifier;

providing a second input signal to an envelope tracker that generates a supply voltage signal for the power amplifier by tracking an envelope of the second input signal; and applying a selected gain value to compensate for intermodulation distortion associated with an intermodulation phase angle, the intermodulation distortion due to the power amplifier mixing the power supply voltage signal with first input signal.

12. The method of claim 11, wherein said providing the first input signal comprising providing a two-tone signal and said providing the second input signal comprising providing a single tone signal.

13. The method of claim 11, further comprising measuring the intermodulation phase angle, and selecting the selected gain value based on the measured intermodulation phase angle.

14. The method of claim 11, further comprising applying, to the second input signal or the supply voltage signal, a delay value selected to compensate for the intermodulation distortion.

15. The method of claim 11, wherein said applying the selected gain value includes adjusting a magnitude of the first input signal or the supply voltage signal.

16. A method of operating a power amplifier:

providing a first input signal to a signal input path of the power amplifier;

providing a second input signal to an envelope tracker that generates a supply voltage signal for the power amplifier by tracking an envelope of the second input signal; and applying a selected delay value to compensate for intermodulation distortion associated with an intermodulation phase angle, the intermodulation distortion due to the power amplifier mixing the power supply voltage signal with first input signal.

17. The method of claim 16, wherein said providing the first input signal comprising providing a two-tone signal and said providing the second input signal comprising providing a single tone signal.

18. The method of claim 16, wherein said applying the selected delay value includes applying the selected delay value to the second input signal or the supply voltage signal.

19. The method of claim 16, further comprising measuring the intermodulation phase angle, and selecting the selected delay value based on the measured intermodulation phase angle.

20. The method of claim 16, further comprising applying a selected gain value to adjust a magnitude of the first input signal or the supply voltage signal and compensate for the intermodulation distortion.

* * * * *